US007075970B2

(12) United States Patent  (10) Patent No.: US 7,075,970 B2
Maru  (45) Date of Patent: Jul. 11, 2006

(54) METHOD OF DECODING TURBO-ENCODED DATA AND RECEIVER FOR DECODING TURBO-ENCODED DATA

(75) Inventor: Tsuguo Maru, Tokyo (JP)

(73) Assignee: NEC Corporation, Tokyo (JP)

( * ) Notice: Subject to any disclaimer, the term of this patent is extended or adjusted under 35 U.S.C. 154(b) by 329 days.

(21) Appl. No.: 09/896,479

(22) Filed: Jun. 29, 2001

(65) Prior Publication Data

US 2002/0080510 A1    Jun. 27, 2002

(30) Foreign Application Priority Data

Jun. 29, 2000    (JP)    ............................. 2000-196747

(51) Int. Cl.
*H04B 1/69*    (2006.01)
*H04L 27/06*    (2006.01)
*H04I 27/08*    (2006.01)

(52) U.S. Cl. ...................... 375/140; 375/340; 375/346; 455/522

(58) Field of Classification Search ................ 375/340, 375/147; 714/796, 794, 786, 755, 792; 370/328, 370/335, 342; 455/522, 67.13, 69
See application file for complete search history.

(56) References Cited

U.S. PATENT DOCUMENTS

| 6,192,501 B1 * | 2/2001 | Hladik et al. ................ 714/786 |
| 6,304,995 B1 * | 10/2001 | Smith et al. ................ 714/786 |
| 6,304,996 B1 * | 10/2001 | Van Stralen et al. ........ 714/796 |
| 6,542,558 B1 * | 4/2003 | Schulist et al. ............. 375/340 |
| 6,556,549 B1 * | 4/2003 | Bender et al. .............. 370/328 |
| 6,771,978 B1 * | 8/2004 | Kayama et al. ............. 455/522 |
| 6,798,758 B1 * | 9/2004 | Chun et al. ................. 370/335 |

FOREIGN PATENT DOCUMENTS

| EP | 1 017 178 A | 7/2000 |
| EP | 1 054 523 A | 11/2000 |
| GB | 2 354 818 A | 4/2001 |

(Continued)

OTHER PUBLICATIONS

The estimation of a CDMA personal system with feedback power control□□Li Zhengmao; Lu Bing; Lu Fan; Universal Personal Communications. 1995. Record., 1995 Fourth IEEE International Conference on: Nov. 6-10, 1995 pp. 344-347.*

(Continued)

*Primary Examiner*—Jay K. Patel
*Assistant Examiner*—Jacob Meek
(74) *Attorney, Agent, or Firm*—Dickstein, Shapiro, Morin & Oshinsky, LLP.

(57) ABSTRACT

A method of decoding turbo-encoded, received data in CDMA (Code Division Multiple Access) system which carries out closed-loop control to electric power of a data transmitter, based on a signal to interference ratio, includes the steps of (a) weighting reverse-diffused, received data, based on both the signal to interference ratio and data obtained when the signal to interference ratio is measured, (b) carrying out ACS operation or comparison/selection operation in a process of updating alpha metric, a process of updating beta metric, and a process for computing likelihood, to the thus weighted, received data, and (c) compensating for results of the ACS operation, based on a predetermined value associated with a difference generated when the ACS operation or the comparison/selection operation is carried out.

32 Claims, 13 Drawing Sheets

FOREIGN PATENT DOCUMENTS

| | | |
|---|---|---|
| JP | 6-132936 | 5/1994 |
| JP | 6-261021 | 9/1994 |
| JP | 9-261203 | 10/1997 |
| JP | 2877248 | 1/1999 |
| JP | 2000-4196 | 1/2000 |
| JP | 2001-24521 | 1/2001 |
| JP | 2003-501859 | 1/2003 |
| WO | WO 00/74247 A1 | 12/2000 |

OTHER PUBLICATIONS

Novel predictive power control in a CDMA mobile radio system☐☐Lau, F.C.M.; Tam, W.M.; Vehicular Technology Conference Proceedings, 2000. VTC 2000-Spring Tokyo. 2000 IEEE 51st☐☐vol. 3, May 15-18, 2000 pp. 1950-1954 vol. 3.*

Copy of article by Berrou et al., Near Shannon Limit Error—Correcting Coding and Decoding: Turbo-Codes (1), Ecole Nationale Superieure des Telecommunications de Bretagne, France (1993).

Copy of article by Bahl et al., "Optimal Decoding of Linear Codes for Minimizing Symbol Error Rate", International Symposium on Information Theory, Asilomar, California, U.S.A. (1973).

Copy of Japanese Office Action dated Jun. 11, 2003 (and English translation of relevant portion).

Robertson et al., "A Comparison of Optimal and Sub-Optimal MAP Decoding Algorithms Operating in the Log Domain", Institute for Communications Technology, German Aerospace Research Establishment, Oberpfaffenhofen, Germany, vol. 2, pp. 1009-1013 (1995).

Communication, European Search Report, 01305811.0-2206-, Dec. 21, 2001.

* cited by examiner

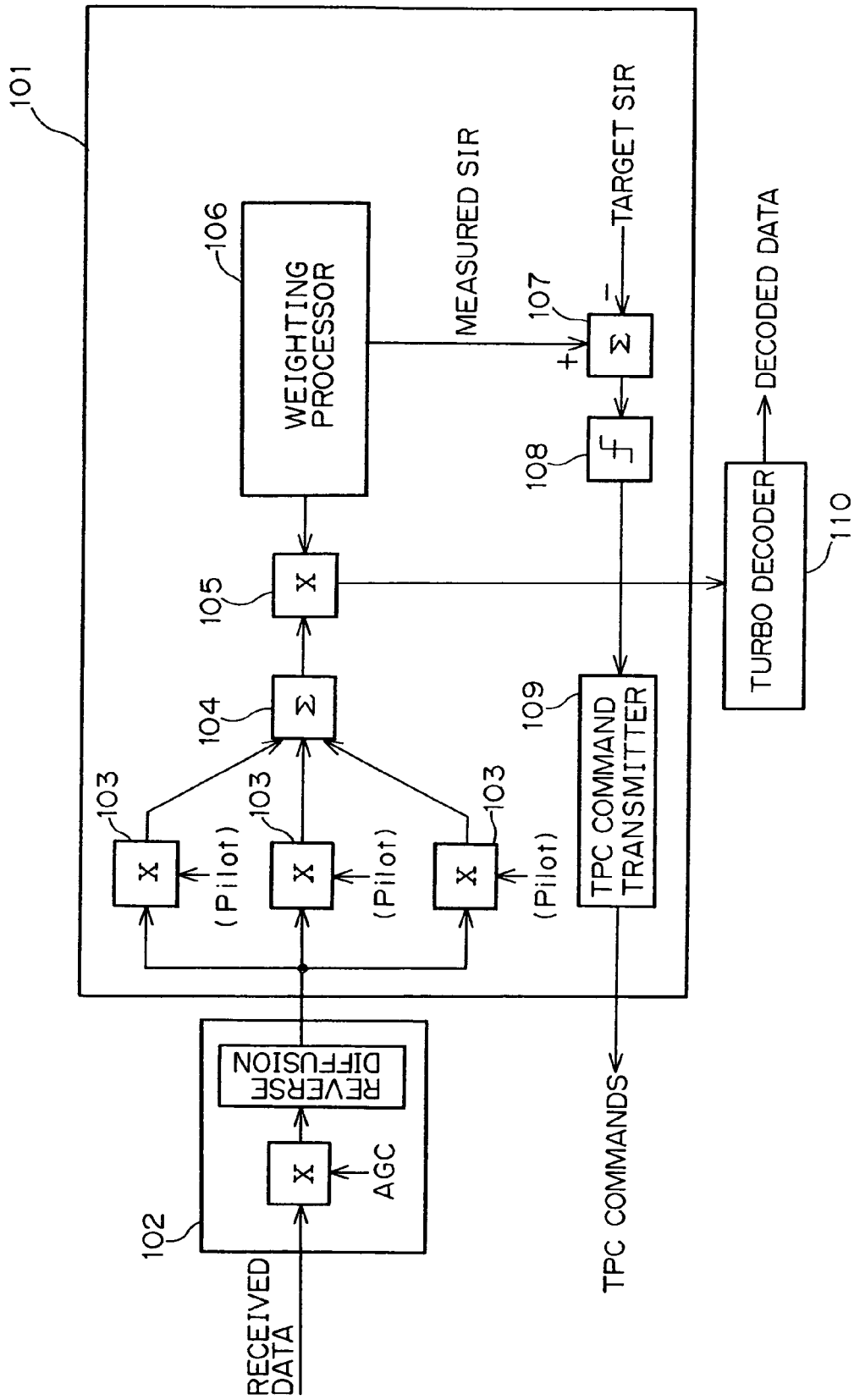
F I G. 1

METHOD OF DECODING TURBO-ENCODED DATA AND RECEIVER FOR DECODING TURBO-ENCODED DATA

BACKGROUND OF THE INVENTION

1. Field of the Invention

The invention relates to a method of decoding turbo-encoded data and a receiver for decoding turbo-encoded data both of which are suitable to a mobile communication system which operates in CDMA (Code Division Multiple Access).

2. Description of the Related Art

There has been suggested a method of encoding data, called a turbo code, in which an error rate close to Shannon limit can be accomplished in encoding data, by C. Berrou et al. This method is explained in detail, for instance, in Proceeding of International Conference of communication, pp. 1064–1070, May 1993.

The method of turbo-encoding data is characterized by the step of dividing a code having high complexity in decoding data, into a plurality of components each having low complexity in decoding data, to thereby successively enhance accuracy in decoding data by virtue of interaction among those components. Division of a code having high complexity in decoding data, into a plurality of components each having low complexity in decoding data is carried out by a maximum posterior probability (MAP) decoder which carries out soft-input and soft-output decoding.

BCJR (Bahl, Cocke, Jelinek and Raviv) algorithm is known as an algorithm for consistently accomplishing MAP decoding, but is accompanied with a problem of necessity of too much calculation. In order to reduce calculation, there have been suggested Max-Log MAP algorithm and SOVA (Soft-Output Viterbi Algorithm) both of which carry out approximate calculation. Herein, Max-Log MAP algorithm which carries out approximation of calculation in BCJR algorithm in log domain, and SOVA algorithm is a process to have soft-input and soft-output on the basis of Viterbi algorithm.

In CDMA mobile communication system, a control to power of a data transmitter is made in order to keep the power at minimum and increase system capacity as much as possible. In addition, since CDMA system can have a high gain in encoding data, by virtue of statistics multiple, enhancement in an ability of decoding data in a turbo decoder would bring a merit that the number of subscribers covered by the CDMA system can be increased.

However, the above-mentioned Max-Log MAP algorithm and SOVA algorithm are accompanied with a problem of degradation in characteristics thereof, though they can reduce calculation.

In order to solve the problem, there is known a method of carrying out calculation equivalent to BCJR algorithm, in log domain, with reference to a table in which a correction term fc $(|\delta_1-\delta_2|)$ is defined as a function of $(|_1-\beta_2|)$ in Max-Log MAP, based on Jacobian Logarithm.

$$\ln(e^{\delta_1}+e^{\delta_2})=\max(\delta_1,\delta_2)+\ln(1+e^{-|\delta_2-\delta_1|})=\max(\delta_1,\delta_2)+fc(|\delta_2-\delta_1|) \qquad (1)$$

However, if the above-mentioned equation (1) were arranged into a table, it would be unavoidable for the table to become large in size.

For instance, hereinbelow is explained a process of updating alpha metric as an example. The alpha metric and above-mentioned beta metric and gamma metric correspond to $\alpha$, $\beta$ and $\gamma$, respectively, and are described in detail, for instance, in IEEE Transaction on Information Theory, pp. 284–287, March 1974.

First, it is assumed that two alpha metrics selected on a torelis at that time are expressed as $\alpha_1$ and $\alpha_2$, and values of the alpha metrics in a log domain are expressed as $\alpha_{log\ 1}$ and $\alpha_{log\ 2}$. That is, $\alpha_1$ and $\alpha_2$ are expressed as follows.

$$\alpha_1 = \exp[\alpha_{log\ 1}]$$

$$\alpha_2 = \exp[\alpha_{log\ 2}]$$

In addition, it is assumed that gamma metrics associated with the alpha metrics on a torelis are expressed as $\gamma_1$ and $\gamma_2$, and values of the gamma metrics in a log domain are expressed as $\gamma_{log\ 1}$ and $\gamma_{log\ 2}$. Unless explicitly expressed, a product of $\alpha_1$ and $\gamma_1$ is equal to or greater than a product of $\alpha_2$ and $\gamma_2$ ($\alpha_1\gamma_1 \geq \alpha_2\gamma_2$).

Herein, it is assumed that an alpha metric having been updated is expressed as $\alpha_3$, a value of the alpha metric $\alpha_3$ in a log domain is expressed as follows.

$$\ln[\alpha_3] = \ln[\alpha_1 \cdot \gamma_1 + \alpha_2 \cdot \gamma_2] = \ln\left[(\alpha_1 \cdot \gamma_1) \cdot \left(1 + \frac{\alpha_2 \cdot \gamma_2}{\alpha_1 \cdot \gamma_1}\right)\right] \therefore \alpha_{log5} = \qquad (2)$$
$$\alpha_{log1} + \lambda_{log1} + \ln[1 + \exp\{\alpha_{log2} + \gamma_{log2} - \alpha_{log1} - \gamma_{log1}\}]$$

Accordingly, a term corresponding to the correction term fc $(|\delta_1-\delta_2|)$ in the above-mentioned equation (1) is expressed as follows.

$$fc(|\delta_1-\delta_2|)=\ln\ [1+\exp\ \{\alpha_{log\ 2}+\gamma_{log\ 2}-\alpha_{log\ 1}-\gamma_{log\ 1}\}] \qquad (3)$$

Herein, the gamma metric is expressed as follows.

$$\gamma_{log1} = \ln\left\{\prod_i \frac{1}{\sqrt{2\cdot\pi}\cdot\sigma}\exp\left[-\frac{\{y_{1i} - \sqrt{K_s}\cdot(2\cdot x_{1i}-1)\}^2}{2\cdot\sigma^2}\right]\right\} \qquad (4)$$

The equation (4) is substituted for the equation (3) to thereby cancel common terms. As a result, the following equation (5) is obtained.

$$f_c(|\delta_1-\delta_2|) = \qquad (5)$$
$$\ln\left[1+\exp\left\{\alpha_{log2}-\alpha_{log1}+\sum_i\frac{\{y_{2i}\cdot\sqrt{K_s}\cdot(2\cdot x_{2i}-1)\}}{\sigma^2} - \sum_i\frac{\{y_{1i}\cdot\sqrt{K_s}\cdot(2\cdot x_{1i}-1)\}}{\sigma^2}\right\}\right]$$

In the equation (5), the correction term fc $(|\delta_1-\delta_2|)$ contains noise variance $\sigma^2$ and signal component Es. Hence, it is necessary to update values in Jacobian table by multi-pass fading each time noises and/or signal levels are varied.

However, since noise variance $\sigma^2$ and signal component Es are contained also in a process of updating beta metric and an equation for computing likelihood, it would be necessary for a memory to have a great capacity.

In addition, it would be necessary for a circuit to include an additional memory to store noise variance $\sigma^2$ and signal component Es associated with positions of bits in each of information sequence and parity sequence, resulting in an increase in a size of the circuit. This would make it impossible to fabricate the circuit in a small size, in low consumption of power, and in small fabrication costs. Furthermore, steps of measuring noise variance $\sigma^2$ and signal component Es have to be additionally carried out.

Since a process of referring to a table comprised of a memory having a great capacity is carried out at a low rate, such a low rate would be a bottle neck for processing rates of ACS circuit and a comparison/selection circuit both of which cannot have a pipeline structure.

Japanese Unexamined Patent Publication No. 6-132936 has suggested a digital transmission system in which digital data to be transmitted is encoded by means of an encoding circuit at a transmitter, the thus encoded data is transmitted in the form of a modulated signal into a transmission path, and the modulated signal is decoded by means of a decoding circuit at a recipient. The encoding circuit is comprised of a first unit which groups channels in accordance with an importance of digital data to be transmitted, a second unit which weights the digital data in accordance with a predetermined weighting method, and a modulator which multiplexes the weighted digital data to thereby produce a modulated signal and transmits the thus produced modulated signal into a transmission path. The decoding circuit is comprised of a demodulator which receives the modulated signal and demodulates the received modulated signal, a third unit which checks receipt condition in each of channels in accordance with the thus demodulated digital data, and a data selector which selects the digital data in an order of highly weighted channels in accordance with the receipt condition in each of channels.

Japanese Unexamined Patent Publication No. 9-261203, based on U.S. patent application Ser. No. 08/617,462 filed on Mar. 18, 1996, has suggested a method of determining a weighting coefficient in CDMA radio-signal receiver, including the steps of receiving a first expression expressed in desired RF signals, transmitting a plurality of first data signals in accordance with the first expression, transmitting a plurality of first pilot signals in accordance with the first expression, measuring first total power of received signals, and determining a plurality of first weighting coefficients in accordance with the data signals, the pilot signals and the first total power.

Japanese Patent No. 2877248 (Japanese Unexamined Patent Publication No. 8-37515) has suggested a method of controlling power of a first transmission signal transmitted from a first station, in accordance with a control signal included in a second transmission signal transmitted from a second station and received at the first station. The method includes the steps of decoding the second transmission signal at the first station by means of a first Viterbi decoder including a path memory having a first predetermined length, decoding the second transmission signal at the first station by means of a second Viterbi decoder including a path memory having a second predetermined length shorter than the first predetermined length, extracting the control signal from output signals transmitted from the second Viterbi decoder, at the first station, controlling power of the first transmission signal in accordance with the control signal having been extracted from the output signals transmitted from the second Viterbi decoder, and extracting data other than the control signal, from output signals transmitted from the first Viterbi decoder, at the first station.

Japanese Unexamined Patent Publication No. 6-261021, based on U.S. patent application Ser. No. 07/991,841 filed on Dec. 16, 1992, has suggested a device used in CDMA system in which encoded user signals are transmitted to each of a plurality of users, the user signals are produced by processing user signals with associated sequence of encoding coefficients, and a received signal includes a combination of the encoded user signals. The device is comprised of means for receiving samples of the received signals received at a predetermined interval, and means for predicting users' symbols in response to the samples through the use of the extracted sequence of encoding coefficients. The sequence of encoding coefficients is defined as an interactive function of a sequence of encoding coefficients, associated with the users, and a sequence of encoding coefficients, associated with other user.

Japanese Unexamined Patent Publication No. 2000-4196, based on U.S. patent application Ser. No. 09/038,724, has suggested a multiple access system of communication across a wireless interface, including a turbo encoder for turbo coding signal representations of packets of information, a transmitter for transmitting a first signal representation of a first packet of information and a second signal including a re-transmission of part of the first signal and a new signal representation of a second packet of information, a receiver for receiving the signal representations, and a means for processing the signal representations by combining the transmitted signals with the re-transmitted signals to obtain an output signal representation of the packet of information the transmitted and re-transmitted signals being combined using rake processing.

The above-mentioned problems remain unsolved even in the above-mentioned Publications.

SUMMARY OF THE INVENTION

In view of the above-mentioned problems in the conventional turbo decoder used in CDMA mobile communication system, it is an object of the present invention to provide a method of decoding turbo-encoded, received data in CDMA system, which is capable of enhancing decoding performances with a minimum increase in a hard ware and a soft ware, exerting a minimum influence on a processing rate, and accomplishing a small-sized circuit with a light weight and small power consumption.

In one aspect, there is provided a method of decoding turbo-encoded, received data in CDMA (Code Division Multiple Access) system which carries out closed-loop control to electric power of a data transmitter, based on a signal to interference ratio, the method including the steps of (a) weighting reverse-diffused, received data, based on both the signal to interference ratio and data obtained when the signal to interference ratio is measured, (b) carrying out ACS operation or comparison/selection operation in a process of updating alpha metric, a process of updating beta metric, and a process for computing likelihood, to the thus weighted, received data, and (c) compensating for results of the ACS operation, based on a predetermined value associated with a difference generated when the ACS operation or the comparison/selection operation is carried out.

There is further provided a method of decoding turbo-encoded, received data in CDMA (Code Division Multiple Access) system which carries out closed-loop control to electric power of a data transmitter, based on a signal to interference ratio, the method including the steps of (a) weighting reverse-diffused, received data, based on both the signal to interference ratio and data obtained when the signal to interference ratio is measured, (b) carrying out ACS operation or comparison/selection operation in a process of updating alpha metric, a process of updating beta metric, and a process for computing likelihood, to the thus weighted, received data, and (c) compensating for results of the ACS operation in at least one of the process of updating alpha metric, the process of updating beta metric, and the process for computing likelihood, based on a predetermined value associated with a difference generated when the ACS operation or the comparison/selection operation is carried out.

It is preferable that the step (a) is carried out in each of slot periods.

For instance, the step (a) may be designed to include a step of multiplying X with the reverse-diffused, received data, the X being defined as a value which is in proportion to a value obtained by dividing a root of a signal power per a slot by an interference power per a slot.

It is preferable that the comparison/selection operation is carried out by means of a subtracting circuit, and the results of the ACS operation are compensated for by means of a logic circuit which receives an output or an absolute value of an output of the subtracting circuit, and outputs a predetermined value in accordance with the output.

For instance, the step (a) may be carried out through a firmware defined by a processor for processing digital signals, and the step (c) may be carried out through a hardware including a logic gate.

In another aspect of the present invention, there is provided a receiver for decoding turbo-encoded, received data in CDMA (Code Division Multiple Access) system which carries out closed-loop control to electric power of a data transmitter, based on a signal to interference ratio, the receiver including (a) a power controller for weighting reverse-diffused, received data, based on both the signal to interference ratio and data obtained when the signal to interference ratio is measured, and (b) a turbo decoder which carries out ACS operation or comparison/selection operation in a process of updating alpha metric, a process of updating beta metric, and a process for computing likelihood, to the thus weighted, received data, and compensates for results of the ACS operation, based on a predetermined value associated with a difference generated when the ACS operation or the comparison/selection operation is carried out.

There is further provided a receiver for decoding turbo-encoded, received data in CDMA (Code Division Multiple Access) system which carries out closed-loop control to electric power of a data transmitter, based on a signal to interference ratio, the receiver including (a) a power controller for weighting reverse-diffused, received data, based on both the signal to interference ratio and data obtained when the signal to interference ratio is measured, and (b) a turbo decoder which carries out ACS operation or comparison/selection operation in a process of updating alpha metric, a process of updating beta metric, and a process for computing likelihood, to the thus weighted, received data, and compensates for results of the ACS operation in at least one of the process of updating alpha metric, the process of updating beta metric, and the process for computing likelihood, based on a predetermined value associated with a difference generated when the ACS operation or the comparison/selection operation is carried out.

It is preferable that the power controller carries out weighting reverse-diffused, received data in each of slot periods.

It is preferable that the power controller multiplies X with the reverse-diffused, received data, the X being defined as a value which is in proportion to a value obtained by dividing a root of a signal power per a slot by an interference power per a slot.

For instance, the turbo decoder may be comprised of (b1) a subtracting circuit which carries out the comparison/selection operation, and (b2) a logic circuit which compensates for the results of the ACS operation, the logic circuit receiving an output or an absolute value of an output of the subtracting circuit, and outputting a predetermined value in accordance with the output It is preferable that the power controller weights reverse-diffused, received data through a firmware defined by a processor for processing digital signals, and the turbo decoder compensates for the results of the ACS operation through a hardware including a logic gate.

In still another aspect of the present invention, there is provided a combination of a turbo encoder for turbo-encoding data to be transmitted, and the above-mentioned receiver for decoding turbo-encoded, received data in CDMA (Code Division Multiple Access) system which carries out closed-loop control to electric power of a data transmitter, based on a signal to interference ratio, the turbo encoder including a plurality of component encoders arranged in parallel with one another.

For instance, the turbo encoder may be designed to include (a) first to N-th component encoders each of which receives information sequence to be encoded, wherein N is an integer equal to or greater than 2, (b) an interleaver connected to the component encoders in parallel to rearrange the information sequence in accordance with a predetermined rule, the interleaver receiving the information sequence and transmitting the information sequence to the second to N-th component encoders, and (c) a switch which switches parity sequence transmitted the component encoders.

There is further provided a combination of a turbo encoder for turbo-encoding data to be transmitted, and the above-mentioned receiver for decoding turbo-encoded, received data in CDMA (Code Division Multiple Access) system which carries out closed-loop control to electric power of a data transmitter, based on a signal to interference ratio, the turbo encoder including a plurality of component encoders arranged in series.

For instance, the turbo encoder may be designed to include (a) an external encoder which receives information sequence to be encoded, (b) a puncturing circuit which punctures information sequence and parity sequence both transmitted from the external encoder, (c) an interleaver which rearranges bit arrangement in the information sequence and the parity sequence each in accordance with a predetermined rule, and (d) an internal encoder which receives the information sequence from the interleaver, and separates the information sequence and the parity sequence from each other.

In still another aspect of the present invention, there is provided a recording medium readable by a computer, storing a program therein for causing a computer to carry out the above-mentioned method of decoding turbo-encoded, received data in CDMA (Code Division Multiple Access) system which carries out closed-loop control to electric power of a data transmitter, based on a signal to interference ratio.

There is further provided a recording medium readable by a computer, storing a program therein for causing a computer to act as the above-mentioned receiver for decoding turbo-encoded, received data in CDMA (Code Division Multiple Access) system which carries out closed-loop control to electric power of a data transmitter, based on a signal to interference ratio.

The advantages obtained by the aforementioned present invention will be described hereinbelow.

In accordance with the present invention, since data to be input into the turbo decoder includes data having been weighted in accordance with a signal to interference ratio, it would be possible to fabricate Jacobian table used for compensating for results of updating alpha metric, updating beta metric, and calculation of log likelihood, without data such as noise variance $\sigma^2$ and signal component Es being included in the table.

Accordingly, it is possible to accomplish calculation equivalent to BCJR algorithm without a minimum influence being exerted on a processing rate, with just a minimum increase in hardware. Hence, the present invention makes it possible in the CDMA mobile communication system to minimize power necessary for a transmitter to transmit signals, increase a capacity of the system to thereby increase the number of subscribers, and enhance a quality in receiving signals.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 is a block diagram of an example of a receiver in CDMA mobile communication system.

DESCRIPTION OF THE PREFERRED EMBODIMENTS

Figure 2:
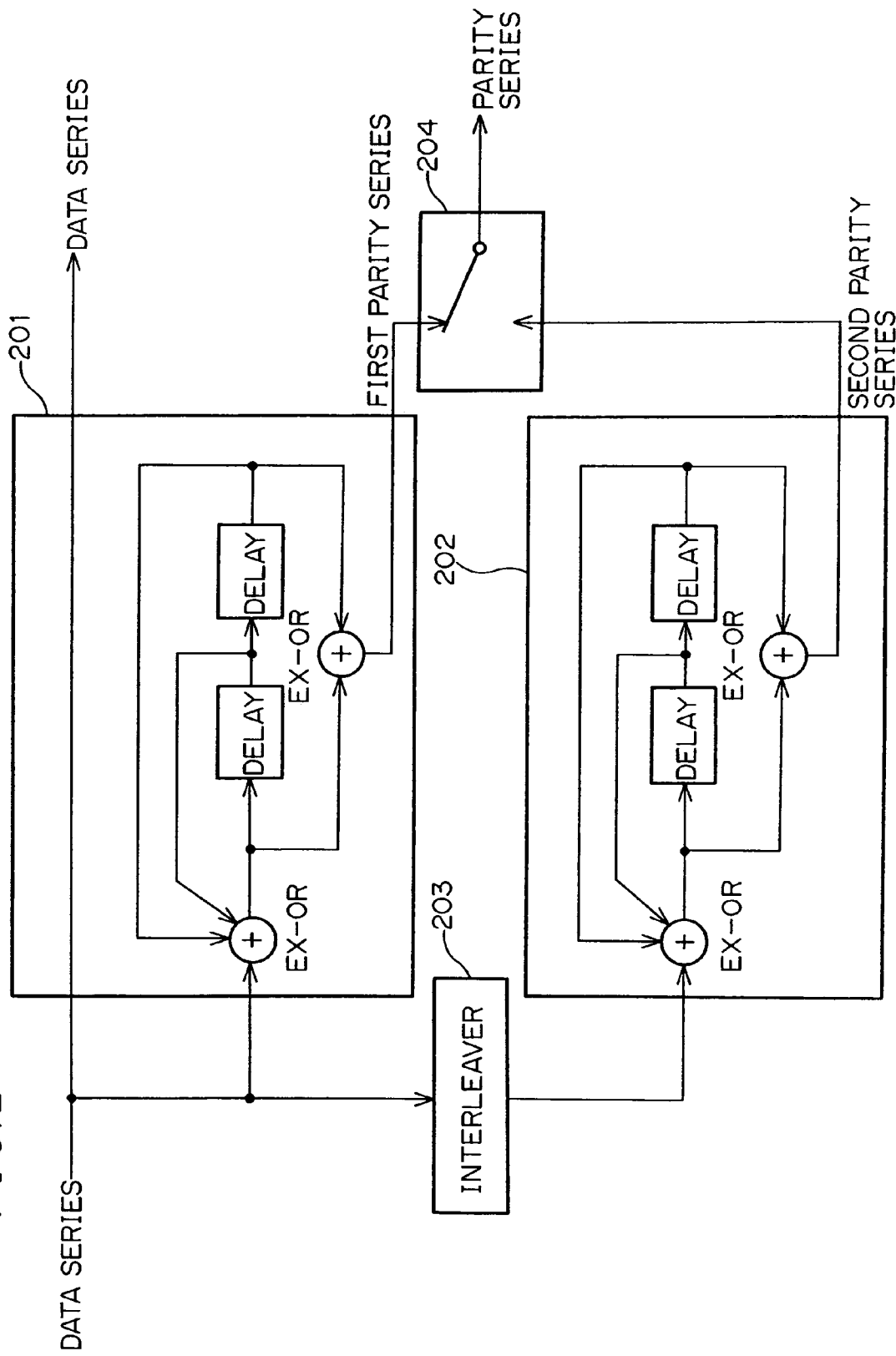
FIG. 2 is a block diagram of an example of a turbo encoder including a plurality of component encoders arranged in parallel with one another.

Preferred embodiments in accordance with the present invention will be explained hereinbelow with reference to drawings.

FIG. 1 is a block diagram of an example of a receiver used in CDMA mobile communication system. FIG. 1 illustrates a structure of a part in the receiver which part carries out steps to be carried out after reverse diffusion.

In FIG. 1, received data is subject to automatic gain control (AGC) and reverse-diffusion in a reverse-diffusion processor 102, and then, is input into a power controller 101 comprised of a digital signal processor (DSP).

The power controller 101 is comprised of a plurality of complex multipliers 103 each associated with each of a plurality of fingers (three fingers in FIG. 1), an coherently adder 104 which rake-combines received data which are made to be in-phase with one another in the complex multipliers 103, a weighting processor 106 which measures a signal interference ratio (SIR), and computes weighting coefficients to be added to the rake-combined signals, a multiplier 105 which multiplies the weighting coefficients computed in the weighting processor 106, with the rake-combined, received data, a subtracter 107 which compares an actually measured SIR to a target SIR, a comparator 108 which converts the results of comparison carried out by the comparator 108, into binary code, and a TPC command transmitter 109 which transmits a TCP command to control power of a transmitter in accordance with the results of comparison carried out by the comparator 108.

A turbo decoder 110 which decodes turbo-encoded data receives outputs of the multiplier 105.

Herein, a signal interference ratio (SIR) means a ratio of power of a received signal to interference power including power of background noises.

The complex multiplier 103 multiplies the reverse-diffused, received data with a conjugate complex number of a pilot symbol obtained by estimation of channels, in each of paths. The received data arranged to be in-phase in the complex multiplier 103 are synthesized in the coherently adder 104. That is, a plurality of the complex multipliers 103 and the coherently adder 104 cooperate with each other to accomplish maximum ratio rake synthesis.

The weighting processor 106, the details of the inputs of which are not shown, measures signal power (S) and interference power (I) in each of paths through the use of pilot symbols, and computes a measured SIR value having been rake-combined, based on the signal power and interference power.

The interference power may be measured by averaging power associated with a plurality of slots, through a primary filter using an forgetting factor.

The weighting processor 106 computes a weighting coefficient defined in the following equation (6), for instance.

$$Q \times 2 \times (Sa)^{1/2}/(Ia) \qquad (6)$$

In the equation (6), Q indicates a constant used for scaling a dynamic range of an output of the coherently adder 104 which output is soft decision data for judgment, Sa indicates signal power per a slot, and Ia indicates interference power per a slot.

In the conventional method, rake-combined received data is transmitted to the turbo-decoder 110 without processing the rake-combined received data. In contrast, in accordance with the present embodiment, the multiplier 105 multiplies the rake-combined received data with a weighting coefficient used for controlling power of a data transmitter, and transmits the thus weighted received data to the turbo decoder 110.

The power controller 101 controls power of a data transmitter in each of slot periods so as to coincide the actually measured SIR with the target SIR. To this end, the subtracter 107 compares the actually measured SIR to the target SIR, and transmits the results of comparison to the comparator 108. The comparator 108 the comparison results received from the subtracter 107, into binary code, and thus produced binary code to the TPC command transmitter 109. The TPC command transmitter 109 produces TPC commands by which power of a data transmitter is increased or decreased, in accordance with output signals transmitted from the comparator 108, inserts the thus produced TPC commands into a power control bit mapped in a frame of a descending link, and transmits the TPC commands.

The above-mentioned closed-loop control to power of a data transmitter is carried out in each of slots. That is, a measured value of the received signal power and a measured value of the interference power which have been weighted are updated in each of slot periods.

A weighting coefficient added to the received signal in the weighting processor 106 is not to be limited to the coefficient defined in accordance with the above-mentioned equation (6). The weighting coefficient is dependent on gamma metric.

Hereinbelow is explained how a weighting coefficient is selected in a process of updating alpha metric computed in the turbo decoder. A base of log is determined as a value associated with a predetermined Q-value.

First, it is assumed that two alpha metrics selected on a torelis at that time are expressed as $\alpha_1$ and $\alpha_2$, and values of the alpha metrics in a log domain in which a base is set equal to a predetermined constant A, are expressed as $\alpha_{log\ 1}$ and $\alpha_{log\ 2}$. That is, $\alpha_1$ and $\alpha_2$ are expressed as follows.

$$\alpha_1 = A\alpha^{log\ 1}$$

$$\alpha_2 = A\alpha^{log\ 2}$$

In addition, it is assumed that gamma metrics associated with the alpha metrics on a torelis are expressed as $\gamma_1$ and $\gamma_2$, and values of the gamma metrics in a log domain are expressed as $\gamma_{log\ 1}$ and $\gamma_{log\ 2}$. It is assumed that an alpha metric having been updated is expressed as $\alpha_3$, and a value of the alpha metric $\alpha_3$ in $\alpha$log domain is expressed as $\alpha_{log\ 2}$.

$$\log_A[\alpha_3] = \tag{7}$$
$$\log_A[\alpha_1 \cdot \gamma_1 + \alpha_2 \cdot \gamma_2] = \log_A\left[(\alpha_1 \cdot \gamma_1) \cdot \left(1 + \frac{\alpha_2 \cdot \gamma_2}{\alpha_1 \cdot \gamma_1}\right)\right] \therefore \alpha_{log3} =$$
$$\alpha_{log1} + \gamma_{log1} + \log_A\left[1 + A^{\{\alpha_{log3}^{-1} \gamma_{log2} \alpha_{log1} \gamma_{log1}\}}\right]$$

A term corresponding to the correction term fc $(|\delta_1 - \delta_2|)$ in the equation (7) is as follows.

$$fc(|\delta_1 - \delta_2|) = \log_A[1 + A^{\{\alpha_{log\ 2} + \gamma_{log\ 2} - \alpha_{log\ 1} - \gamma_{log\ 1}\}}] \tag{8}$$

The gamma metric is expressed as follows.

$$\gamma_{log1} = \log_A\left\{\prod_i \frac{1}{\sqrt{2 \cdot \pi} \cdot \sigma} \exp\left[-\frac{\{y_1 - \sqrt{E_i} \cdot (2 \cdot x_{1i} - 1)\}^2}{2 \cdot \sigma^2}\right]\right\} \tag{9}$$

The equation (9) is substituted for the equation (8) to cancel common terms. As a result, the following equation (10) is obtained.

$$f_c(|\delta_1 - \delta_2|) = \log_A\left[1 + A^{\left\{\alpha_{log2} - \alpha_{log1} + \log_A \exp\left[\sum_i \frac{[y_i \cdot \sqrt{E_s} \cdot (2 \cdot x_{2i})]}{\sigma^2}\right] - \log_A \exp\left[\sum_i \frac{[y_i \cdot \sqrt{E_s} \cdot (2 \cdot x_{1i})]}{\sigma^2}\right]\right\}}\right] \tag{10}$$

Herein, A is set equal to exp [1/Q], and the received data having been weighted is expressed Yi which is determined as follows.

$$A = \exp[1/Q]$$

$$i = y_i \cdot Q \cdot 2 \cdot \frac{\sqrt{E_s}}{\sigma^2} \tag{11}$$

As a result, the following equation (12) is obtained.

$$\alpha_{log3} = \alpha_{log1} + \left[\sum_i Y_i \cdot x_{1i}\right] + \log_A\left[1 + A^{\alpha_{log2} - \alpha_{log1} + \lfloor \Sigma_i Y_i \cdot x_{2i} \rfloor - \lfloor \Sigma_i Y_i \cdot x_{1i} \rfloor}\right] \tag{12}$$

Accordingly, a term corresponding to the correction term fc $(|\delta_1 - \delta_2|)$ in the equation (12) is expressed as follows.

$$f_c(|\delta_1 - \delta_2|) = \log_A\left[1 + A^{\alpha_{log2} - \alpha_{log1} + \lfloor \Sigma_i Y_i \cdot x_{2i} \rfloor - \lfloor \Sigma_i Y_i \cdot x_{1i} \rfloor}\right] \tag{13}$$

Thus, the correction term fc $(|\delta_1 - \delta_2|)$ can be computed without including noise variance $\sigma^2$ and signal component Es therein both of which vary in accordance with fading.

A difference in torelis corresponding to a sum of the alpha metric and the beta metric is represented as follows.

$$\alpha_{log2} - \alpha_{log1} + \left[\sum_i Y_i \cdot x_{2i}\right] - \left[\sum_i Y_i \cdot x_{1i}\right] \tag{14}$$

By using the difference defined in accordance with the equation (14), it would be possible to readily fabricate Jacobian table in a small size to be used for the correction term fc $(|\delta_1 - \delta_2|)$.

The gamma metric to be processed in the turbo decoder 110 is expressed as follows.

$$\left[\sum_i Y_i \cdot x_i\right]$$

Since "x" is equal to 1 or 0, the above-mentioned gamma metric has a value only in a pass associated with x=1 on a torelis, and the gamma metric is equal to 0 in a pass associated with x=0. Here, the weighting coefficient defined in accordance with the equation (6) is used as a weighting coefficient.

It is assumed that the gamma metric is expressed in accordance with the equation (15).

$$y_{log1} = \log_A \left\{ \prod_i \frac{1}{\sqrt{2 \cdot \pi} \cdot \sigma} \exp\left[-\frac{\{y_l - \sqrt{E_s} \cdot (x_{li})\}^2}{2 \cdot \sigma^2}\right] \right\} \quad (15)$$

The equation (15) is substituted for the equation (8) to cancel common terms. As a result, the following equation (16) is obtained.

$$\int_r (|\delta_1 - \delta_2|) = \log_A \left[ 1 + A \left\{ \alpha_{log3} - \alpha_{log1} + \log \cdot e \exp\left[\sum_i \frac{\{y_t \sqrt{E_g} \cdot (x_{2t})\}}{\sigma^2}\right] - \log_t \exp\left[\sum_i \frac{\{y_t \sqrt{E_t} \cdot (x_{1f})\}}{\sigma^2}\right] \right\} \right] \quad (16)$$

Herein, A is set equal to exp [1/Q], and the received data having been weighted is expressed Yi which is determined as follows.

$$A = \exp[1/Q]$$

$$Y_i = y_i \cdot Q \cdot \frac{\sqrt{Es}}{\sigma^2} \quad (17)$$

Thus, there is obtained the following equation (18).

$$\alpha_{log3} - \alpha_{log1} + \left[\sum_t Y_i \cdot x_{1i}\right] + \log_A[1 + A^{\alpha_{log2} \omega_{log1} + [\Sigma_i Y_i \cdot 2_{2l}] - [\Sigma_i Y_T \cdot u]}] \quad (18)$$

A difference on a torelis, associated with a sum of the alpha metric and the gamma metric is expressed as follows.

$$\alpha_{log2} - \alpha_{log1} + \left[\sum_i Y_i \cdot x_{2i}\right] - \left[\sum_i Y_i \cdot x_{li}\right] \quad (19)$$

By using the difference defined in accordance with the equation (19), it would be possible to readily fabricate Jacobian table in a small size to be used for the correction term fc $(|\delta_1 - \delta_2|)$.

When the gamma metric is expressed in accordance with the equation (16), the weighting coefficient is expressed in accordance with the following equation (20).

$$Q \times (Sa)^{1/2}/(Ia) \quad (20)$$

In the equation (20), Q indicates a constant used for scaling a dynamic range of an output of the coherently adder 104 which output is soft decision data for judgment, Sa indicates signal power per a slot, and Ia indicates interference power per a slot.

The gamma metric to be processed in the turbo decoder 110 is expressed as follows.

$$\left[\sum_i Y_i \cdot x_i\right]$$

Since "x" is equal to −1 or +1, the above-mentioned gamma metric could have significant values in paths associated with x=−1 and x=+1 on a torelis.

In the above-mentioned case, the gamma metric is assumed to have Gaussian distribution. However, it should be noted that the gamma metric may be designed to have Rayleigh distribution.

In the first embodiment, the closed-loop power control based on the measured SIR and the process of weighting the rake-combined received data are carried out in a firmware defined by a digital signal processor, and the process of updating the alpha metric, the process of updating the beta metric, both including the above-mentioned Jacobian table, and calculation of likelihood are accomplished by a hardware.

Accordingly, since the received data to be input into the turbo decoder 110 includes weighted data about the interference power and signal power, it would be possible to carry out calculation which is equivalent to BCJR algorithm, through the turbo decoder 110, without using data such as noise variance $\sigma^2$ and signal component Es.

In addition, since it is not necessary for the power controller 101 to transmit data about noise variance $\sigma^2$ and signal component Es to the turbo decoder 110, it is possible to reduce a signal line through which the power controller 101 and the turbo decoder 110 are electrically connected to each other.

Hereinbelow is explained a structure of the turbo encoder and the turbo decoder. The process of updating the alpha metric, the process of updating the beta metric, both including Jacobian table, and the calculation of likelihood, which are to be carried out by the turbo decoder, can be carried out by a hardware comprised of logic gates and memories.

A turbo encoder is grouped into a parallel arrangement type in which a plurality of component encoders is arranged in parallel with one another, and a series arrangement type in which a plurality of component encoders is arranged in series with one another. Each of the component encoders is comprised of a recursive convolution encoder including a plurality of delay units and exclusive ORs (EX-OR).

First, hereinbelow are explained a parallel arrangement type turbo encoder, and a turbo decoder for decoding data encoded by a turbo encoder.

Figure 3:
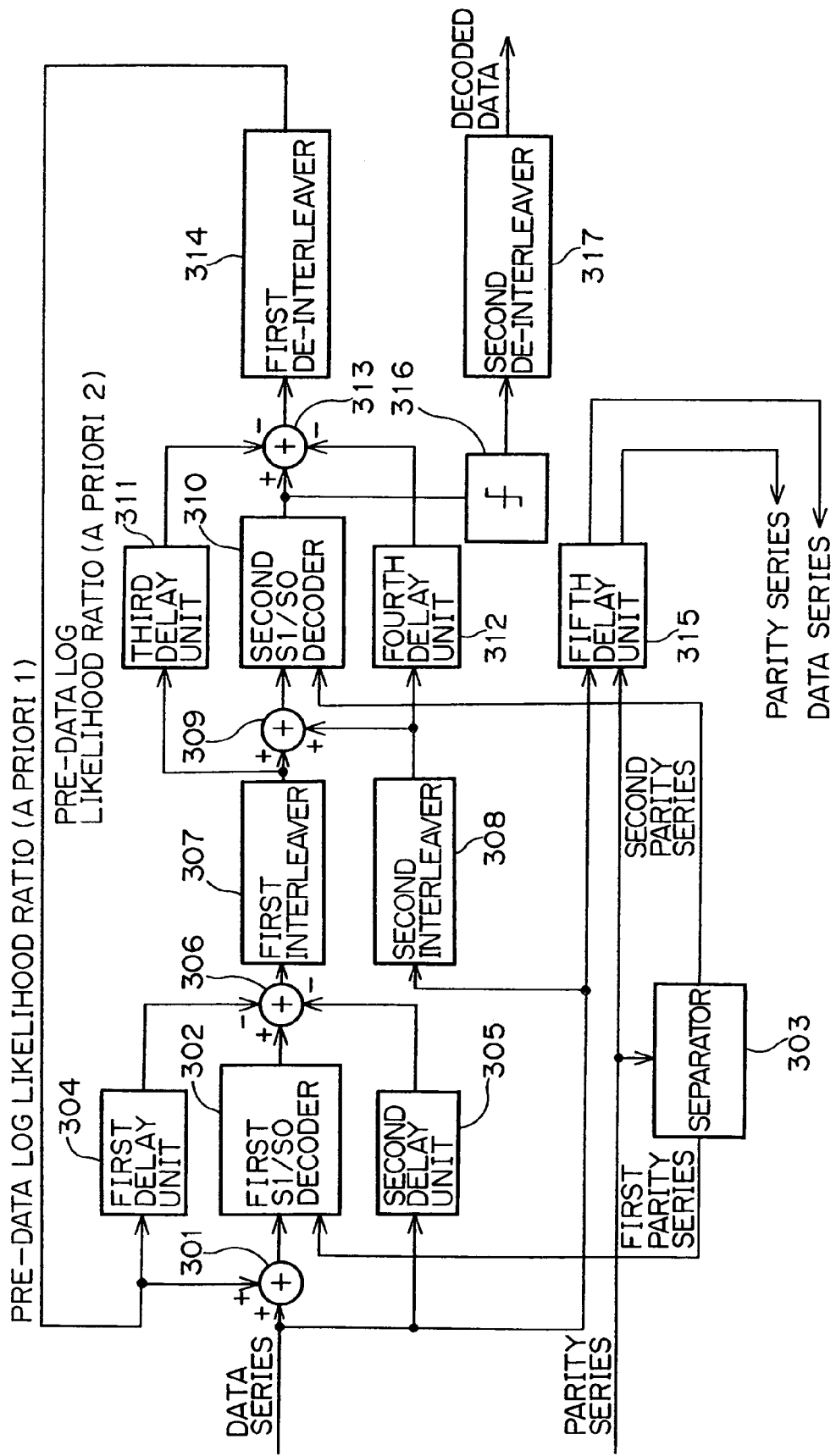
FIG. 3 is a block diagram of an example of a turbo decoder which decodes data having been turbo-encoded by the turbo encoder illustrated in FIG. 2.

FIG. 2 is a block diagram illustrating an example of a parallel arrangement type turbo encoder, and FIG. 3 is a block diagram illustrating an example of a turbo decoder for decoding data turbo-encoded by the turbo encoder illustrated in FIG. 2.

As illustrated in FIG. 2, the parallel arrangement type turbo encoder is comprised of first and second component encoders 201 and 202 into which information sequence to be encoded is input, an interleaver 203 which re-arranges information sequence in accordance with a predetermined rule, and a switch 204 which switches between first parity sequence transmitted from the first component encoder 201 and second parity sequence transmitted from the second component encoder 220.

The first and second component encoders 201 and 202 are connected in parallel with each other. The second component encoder 202 receives information sequence through the interleaver 203.

A turbo encoder usually includes a plurality of component encoders. The turbo encoder illustrated in FIG. 2 includes two component encoders 201 and 202. Though the interleaver 203 plays an important role in turbo-encoding data, since an operation of the interleaver 203 has nothing to do with the present invention, the interleaver 203 will not be explained in detail.

The first component encoder 201 transmits the information sequence and the first parity sequence together, and the second component encoder 202 transmits only the second parity sequence. The parity sequence may be transmitted from the first and second component encoders 201 and 202 with a part of data being omitted by puncturing.

In the turbo encoder, since the information sequence, the first parity sequence and the second parity sequence are alternately transmitted through the switch 204, each of the series has a data transmission rate of ⅓ per a unit period of time.

As illustrated in FIG. 3, the turbo decoder is comprised of a first soft-input and soft-output decoder 302 associated with the first component encoder 201, a second soft-input and soft-output decoder 310 associated with the second component encoder 202, a separator 303 which separates the parity sequence into the first parity sequence and the second parity sequence, a first interleaver 307 which re-arranges bit arrangement in an output signal transmitted from the first soft-input and soft-output decoder 302, a second interleaver 308 which re-arranges bit arrangement in the information sequence, a first de-interleaver 314 which arranges the bit arrangement having been re-arranged by the first and second interleavers 307 and 308, back to their original bit arrangements, a first adder 301 which adds a later mentioned a-priori LLR (log likelihood ratio) to the information sequence, a second adder 306 which adds an output of the first soft-input and soft-output decoder 302, the a-priori LLR (log likelihood ratio), and the information sequence to one another, a first delay unit 304 which makes an output of the first soft-input and soft-output decoder 302, to coincide with a delay of the a-priori LLR (log likelihood ratio), a second delay unit 305 which makes an output of the first soft-input and soft-output decoder 302, to coincide with a delay of the information sequence, a third adder 309 which adds an output of the first interleaver 307 to an output of the second interleaver 308, a fourth adder 313 which adds an output of the first soft-input and soft-output decoder 302, an output of the first interleaver 307, and an output of the second interleaver 308 to one another, a third delay unit 311 which makes a delay in an output of the first interleaver 307, to coincide with an output of the second soft-input and soft-output decoder 310, a fourth delay unit 312 which makes a delay in an output of the second interleaver 308, to coincide with an output of the second soft-input and soft-output decoder 310, a decision unit 316 which makes hard decision, based on an output of the second soft-input and soft-output decoder 310, a second de-interleaver 317 which arranges bit arrangement in an output of the decision unit 316, back to its original bit arrangement to thereby transmit decoded data, and a fifth delay unit 315 which delays the information sequence, the first parity sequence, and the second parity sequence by a predetermined degree.

Herein, the log likelihood ratio indicates a ratio in the form of log which ratio is defined as a ratio of likelihood of desired received symbol to likelihood of received symbol which is in contrary relation to the desired received symbol.

The information sequence to be decoded, the first parity sequence and the second parity sequence include not only data transmitted from the turbo encoder illustrated in FIG. 2, but also soft-judged received data containing errors caused by passing through propagation channel. In addition, the information sequence is multiplied with a weighting coefficient by the multiplier 105 illustrated in FIG. 1.

The parity sequence input into the separator 303 is separated into the first parity sequence and the second parity sequence. The first parity sequence is input into the first soft-input and soft-output decoder 302, and the second parity sequence is input into the second soft-input and soft-output decoder 310.

As illustrated in FIG. 3, the information sequence and the a-priori LLR (log likelihood ratio) (a priori 1) are added to each other in the first adder 301, and then, are input into the first soft-input and soft-output decoder 302. The a-priori LLR (log likelihood ratio) (a priori 1) is designed to have an initial value of zero (0) so as not to have a preference. The first parity sequence separated from the parity sequence in the separator 303 is input also into the first soft-input and soft-output decoder 302. The soft-input and soft-output decoder 302 outputs log likelihood ratios each associated with each of bits.

The second adder 306 subtracts both the a-priori LLR (log likelihood ratio) (a priori 1) synchronized with an output of the first soft-input and soft-output decoder 302 by means of the first delay unit 304 and the information sequence synchronized with an output of the first soft-input and soft-output decoder 302 by means of the second delay unit 305, from the log likelihood ratio transmitted from the first soft-input and soft-output decoder 302. As a result, the second adder 306 transmits a first external data log likelihood consisting of the log likelihood from which both the information sequence and the a-priori LLR (log likelihood ratio) (a priori 1) are removed.

The first extrinsic LLR (log likelihood ratio) is stirred in the first interleaver 307, and then, input into the third adder 309 together with the information sequence having been stirred by the second interleaver 308.

The second soft-input and soft-output decoder 310 receives an output of the third adder 309 and the second parity sequence separated from the parity sequence in the separator 303. An output of the first interleaver 307 defines a a-priori LLR (log likelihood ratio) (a priori 2) to be input into the second soft-input and soft-output decoder 310. The second soft-input and soft-output decoder 310 outputs log likelihood ratios associated with each of bits in the interleaved information sequence.

The fourth adder 313 subtracts both the a-priori LLR (log likelihood ratio) (a priori 2) synchronized with an output of the second soft-input and soft-output decoder 310 by means of the third delay unit 311 and the interleaved information sequence synchronized with an output of the second soft-input and soft-output decoder 310 by means of the fourth delay unit 312, from the log likelihood ratio transmitted from the second soft-input and soft-output decoder 310. As a result, the fourth adder 313 transmits a second external data log likelihood consisting of the log likelihood ratio from which both the interleaved information sequence and the a-priori LLR (log likelihood ratio) (a priori 2) are removed.

The second extrinsic LLR (log likelihood ratio) is re-arranged back to its original bit arrangement by the first de-interleaver 314, and then, fed back to the first soft-input and soft-output decoder 302 as the a-priori LLR (log likelihood ratio) (a priori 1).

The information sequence, the first parity sequence and the second parity sequence are delayed by the fifth delay unit 315, and then, fed back in synchronization with the next updating step.

Hereinafter, the information sequence is decoded by repeatedly carrying out the above-mentioned steps through the use of fed back information sequence and parity sequence. The log likelihood ratio transmitted from the second soft-input and soft-output decoder 310 is subject to hard decision in the decision unit 316, and then, re-arranged back to its original bit arrangement in the second de-interleaver 317, and thereafter, output as decoded data.

Figure 4:
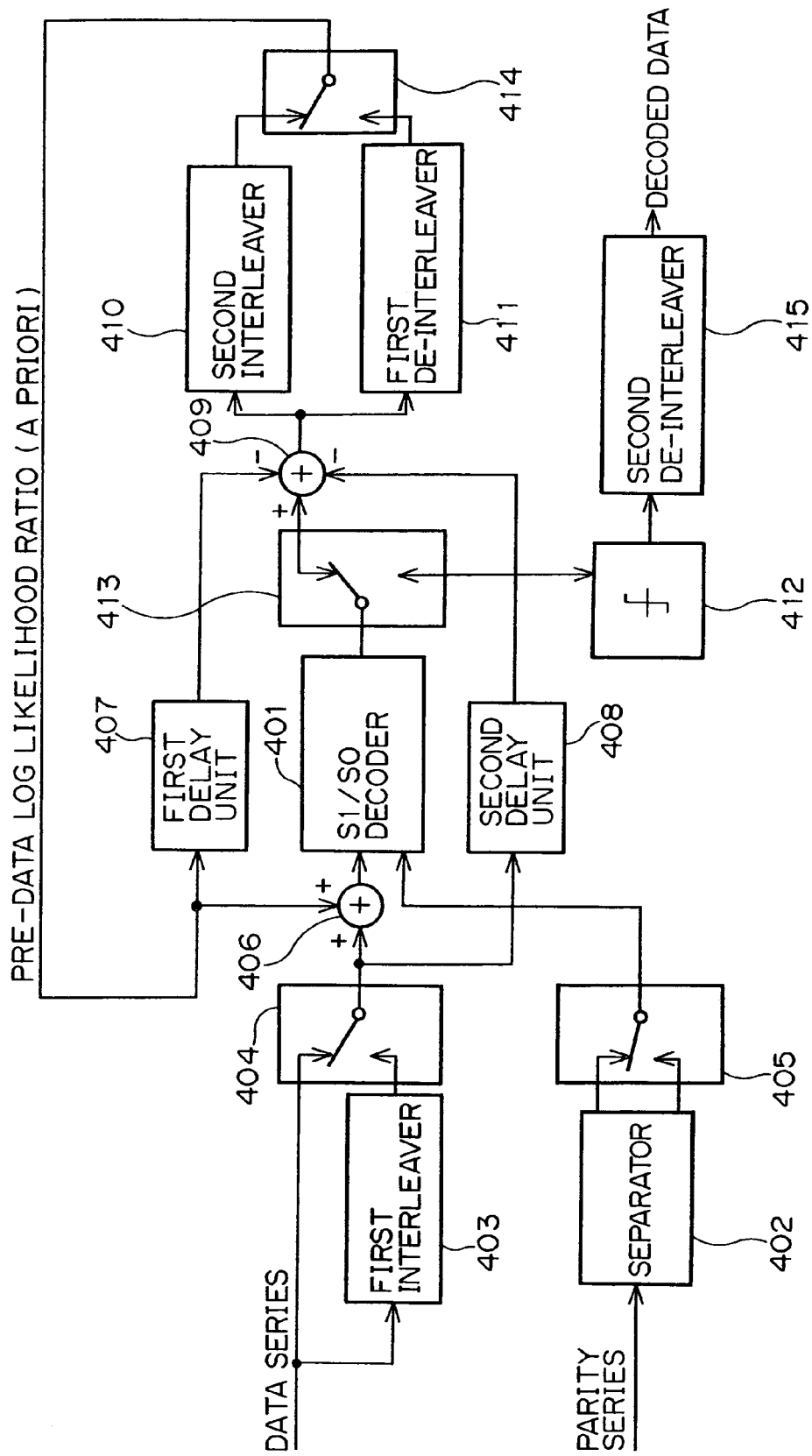
FIG. 4 is a block diagram of an example of the turbo decoder illustrated in FIG. 3 which turbo decoder is designed to be comprised of a single soft-input and soft-output decoder by resource sharing.

FIG. 4 is a block diagram of an example of the turbo decoder illustrated in FIG. 3. The illustrated turbo decoder is designed to be comprised of a single soft-input and soft-output decoder by resource sharing.

The turbo decoder illustrated in FIG. 4 is comprised of a soft-input and soft-output decoder 401 corresponding to the first and second component encoders 201 and 202 illustrated in FIG. 2, a separator 402 which separates the parity sequence into the first parity sequence and the second parity sequence, a first interleaver 403 which re-arranges bit arrangement in the information sequence input into the soft-input and soft-output decoder 401, a first switch 404 through which one of the information sequence and the interleaved information sequence is input into the soft-input and soft-output decoder 401, a second switch 405 through which one of the first and second parity sequence transmitted from the separator 402 is input into the soft-input and soft-output decoder 401, a first adder 406 which adds a a-priori LLR (log likelihood ratio) and the information sequence to each other, a first delay unit 407 which synchronizes a delay of the a-priori LLR (log likelihood ratio) with an output of the soft-input and soft-output decoder 401, a second delay unit 408 which synchronizes a delay of the information sequence with an output of the soft-input and soft-output decoder 401, a second adder 409 which adds an output of the soft-input and soft-output decoder 401, the per-data log likelihood ratio and the information sequence to one another, a second interleaver 410 which re-arranges bit arrangement in a log likelihood transmitted from the second adder 409, a first de-interleaver 411 which re-arranges bit arrangement of a log likelihood transmitted from the second adder 409, back to its original bit arrangement, a decision unit 412 which makes hard decision, based on an output of the soft-input and soft-output decoder 401, a third switch 413 through which an output of the soft-input and soft-output decoder 401 is input into one of the second adder 409 and the decision unit 412, a fourth switch 414 which feeds one of an output of the second interleaver 410 and an output of the first de-interleaver 411 back to the soft-input and soft-output decoder 401 as the a-priori LLR (log likelihood ratio), and a second de-interleaver 415 which re-arranges bit arrangement in an output of the decision unit 412, back to its original bit arrangement, to thereby output decoded data.

The turbo decoder having such a structure as mentioned above, illustrated in FIG. 4, repeatedly feeds the extrinsic LLR (log likelihood ratio), the information sequence and the parity sequence all of which are transmitted from the soft-input and soft-output decoder 401, back to an input of the soft-input and soft-output decoder 401, similarly to the turbo decoder illustrated in FIG. 3.

The information sequence to be input into the soft-input and soft-output decoder 401 is allowed or disallowed to pass through the first interleaver 403 by the first switch 404 in dependence on whether the soft-input and soft-output decoder 401 operates K-th times or L-th times wherein K is an odd integer and L is an even number.

Similarly, the parity sequence is switched into the first or second parity sequence by means of the second switch 405, and then, input into the soft-input and soft-output decoder 401. Specifically, when the soft-input and soft-output decoder 401 operates at K-th times, the information sequence which is not interleaved, and the first parity sequence are input into the soft-input and soft-output decoder 401, and when the soft-input and soft-output decoder 401 operates at L-th times, the information sequence having passed through the first interleaver 403, and the second parity sequence are input into the soft-input and soft-output decoder 401.

The second adder 409 subtracts both the a-priori LLR (log likelihood ratio) (a priori) synchronized with an output of the soft-input and soft-output decoder 401 by means of the first delay unit 407 and the information sequence synchronized with an output of the soft-input and soft-output decoder 401 by means of the second delay unit 408, from the log likelihood ratio transmitted from the soft-input and soft-output decoder 401. As a result, the second adder 409 transmits a first external data log likelihood consisting of the log likelihood ratio from which both the information sequence and the a-priori LLR (log likelihood ratio) (a priori) are removed.

The extrinsic LLR (log likelihood ratio) is input into either the second interleaver 410 or the first de-interleaver 411 in dependence on whether the soft-input and soft-output decoder 401 operates at K-th times or L-th times. A resultant output of either the second interleaver 410 or the first de-interleaver 411 is fed back to the first delay unit 407 and the soft-input and soft-output decoder 401 through the fourth switch 414 as the a-priori LLR (log likelihood ratio).

Specifically, when the soft-input and soft-output decoder 401 operates at K-th times, an output of the first de-interleaver 411 is fed back as the a-priori LLR (log likelihood ratio), and when the soft-input and soft-output decoder 401 operates at L-th times, an output of the second interleaver 410 is fed back as the a-priori LLR (log likelihood ratio).

The first to fourth switches 404, 405, 413 and 414 is controlled in their operation by control signals transmitted from a sequencer (not illustrated).

Hereinafter, the information sequence is decoded by repeatedly carrying out the above-mentioned steps through the use of fed back information sequence and parity sequence. The log likelihood ratio transmitted from the soft-input and soft-output decoder 401 is subject to hard decision in the decision unit 412, and then, re-arranged back to its original bit arrangement in the second de-interleaver 415, and thereafter, output as decoded data.

Figure 5:
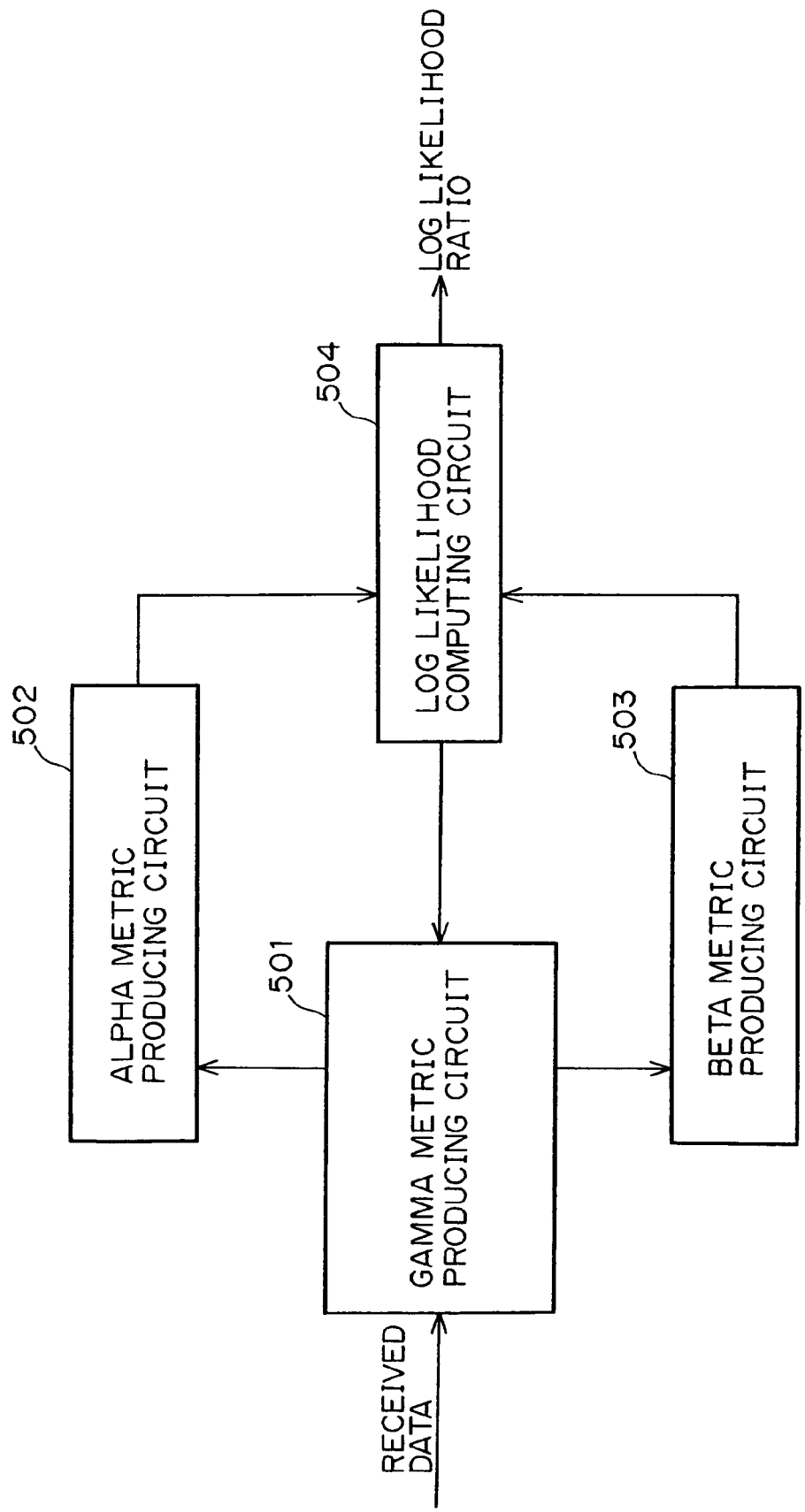
FIG. 5 is a block diagram illustrating an example of the soft-input and soft-output decoder illustrated in FIGS. 3 and 4.

Hereinbelow is explained the soft-input and soft-output decoder which is a part of the turbo decoders illustrated in FIGS. 3 and 4. FIG. 5 is a block diagram of an example of the soft-input and soft-output decoder illustrated in FIGS. 3 and 4.

The soft-input and soft-output decoder illustrated in FIG. 5 is comprised of a gamma metric producing circuit 501 which produces gamma metric, an alpha metric producing circuit 502 which produces alpha metric, a beta metric producing circuit 503 which produces beta metric, and a log likelihood computing circuit 504 which computes a log likelihood ratio, based on results of calculation carried out by the alpha metric producing circuit 502 and the beta metric producing circuit 503.

Received data to be input into the soft-input and soft-output decoder is comprised of the information sequence resulting from multiplication of the rake-combined received data with the weighting coefficients, and correspond to the information sequence, the first parity sequence, and the second parity sequence all illustrated in FIGS. 3 and 4.

The turbo decoder illustrated in FIG. 3 is designed to have the two soft-input and soft-output decoders associated with the first and second parity sequence, and the turbo decoder illustrated in FIG. 4 is designed to have the single soft-input and soft-output decoder which alternately receives the first or second parity sequence. In contrast, in the soft-input and soft-output decoder illustrated in FIG. 5, the gamma metric producing circuit 501 is designed to include a memory (not illustrated) for storing the first and second parity sequence therein, and the first and second parity sequence is read alternately out of the memory.

In the turbo decoder illustrated in FIGS. 3 and 4, addition of the a-priori LLR (log likelihood ratio) and the information sequence to each other is carried out outside the soft-input and soft-output decoder. In contrast, the addition is carried out in the gamma metric producing circuit 501 in the soft-input and soft-output decoder illustrated in FIG. 5.

In the turbo decoder illustrated in FIGS. 3 and 4, the a-priori LLR (log likelihood ratio) and the information sequence are subtracted from the log likelihood ratio output from the soft-input and soft-output decoder, to thereby produce the external data likelihood ratio. The subtraction is carried out outside the soft-input and soft-output decoder. In contrast, the subtraction is carried out in the gamma metric producing circuit 501 in the soft-input and soft-output decoder illustrated in FIG. 5. Accordingly, gamma metric including the computed a-priori LLR (log likelihood ratio) is input into both the alpha metric producing circuit 502 and the beta metric producing circuit 503.

An example of the gamma metric producing circuit 501 is disclosed, for instance, in Japanese Unexamined Patent Publication No. 2001-24521. Hence, the gamma metric producing circuit will not be explained in detail. It should be noted that though the applicant refers to Japanese Unexamined Patent Publication No. 2001-24521, this does not mean that the applicant admits Japanese Unexamined Patent Publication No. 2001-24521 as prior art. Japanese Unexamined Patent Publication No. 2001-24521 is referred to herein only for the purpose of better understanding of the present invention.

Hereinbelow is explained the alpha metric producing circuit 502 with reference to FIG. 6.

Figure 6:
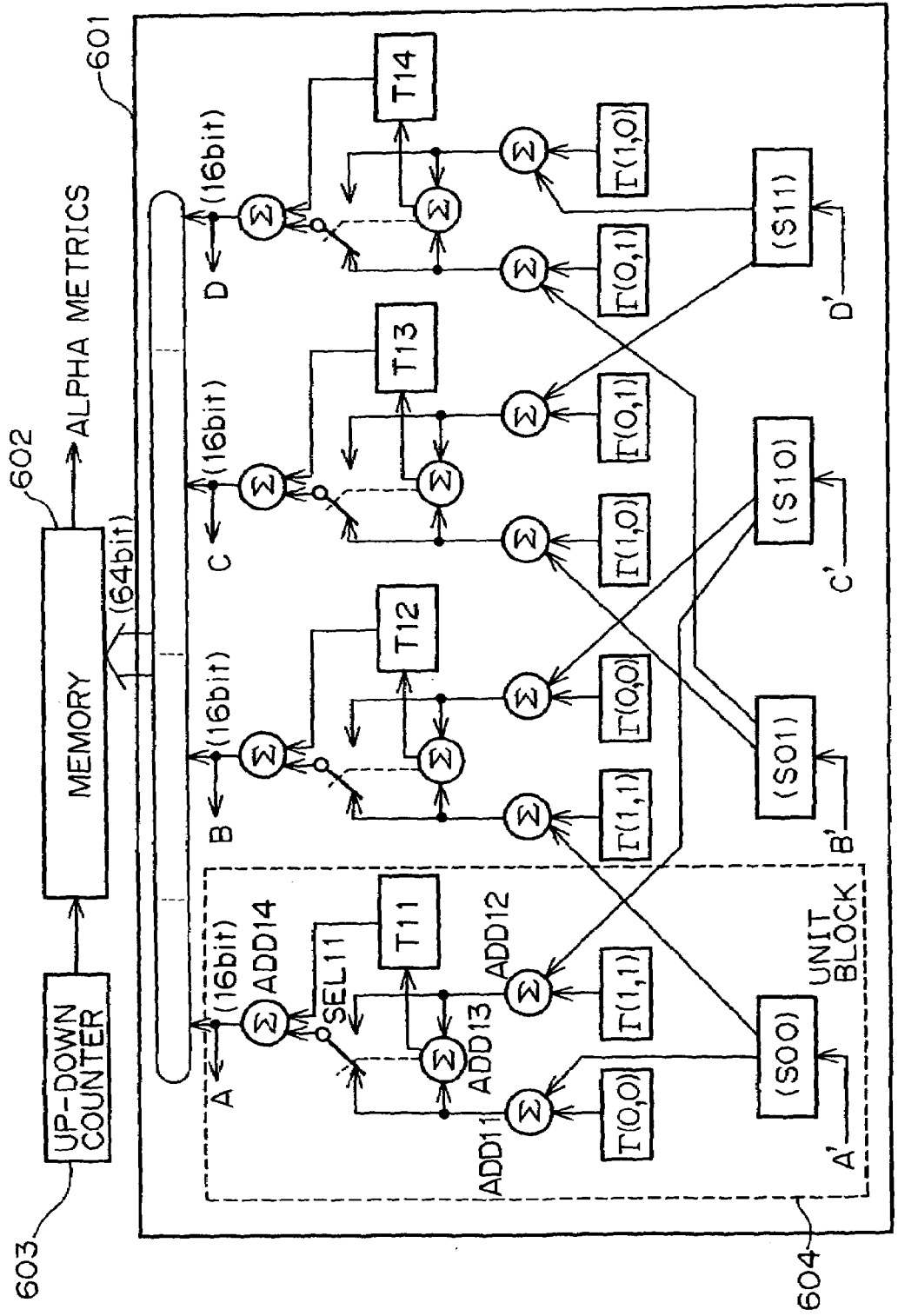
FIG. 6 is a block diagram of an example of the alpha metric producing circuit illustrated in FIG. 5.

FIG. 6 is a block diagram of an example of the alpha metric producing circuit 502 illustrated in FIG. 5.

The illustrated alpha metric producing circuit 502 is comprised of an add-compare select (ACS) circuit 601 which carries out predetermined operations such as addition, subtraction and comparison on which is greater, based on gamma metrics Γ(0, 0), Γ(1, 1), Γ(1, 0) and Γ(0, 1) transmitted from the gamma metric producing circuits 501, a memory 602 for storing therein alpha metrics produced by the ACS circuit 601, and an up-down counter 603 comprised of an address counter for controlling addresses used for storing alpha metrics.

ACS circuit 601 illustrated in FIG. 6 is designed to have a structure in order to carry out calculation for a metric including four states (S00, S01, S10, S11), completely in parallel with one another. ACS circuit 601 is applicable to calculation of an alpha metric including eight states, for instance.

In FIG. 6, signal points A and A', signal points B and B', signal points C and C', and signal points D and D' are connected to each other, respectively, and results of calculation of alpha metrics are fed back to a state register (S00, S01, S10, S11), and updated in the state register. The state register (S00, S01, S10, S11) in ACS circuit 601 and each of adders are connected through wires in accordance with a predetermined torelis chart.

ACS circuit 601 is comprised of the same four circuits which are different from one another only in connection between the state register and the adder. Hereinbelow is explained an operation of the circuit located leftmost in FIG. 6. The circuit is designated as a unit block 604.

An output of the state register (S00), and a gamma metric Γ(0, 0) are input into an adder ADD 11 in the unit block 604. An output of the state register (S10), and a gamma metric Γ(1, 1) are input into an adder ADD 12 in the unit block 604.

An adder (or subtracter) ADD 13 receives outputs of the adders ADD 11 and 12, and compares them to each other to detect which one is greater. Outputs of the adders ADD 11 and 12 are input into a selector SEL 11. The selector SEL 11 selects one of the outputs of the adders ADD 11 and 12 in accordance with results of comparison carried out by the adder ADD 13, and transmits the selected output.

The adder ADD 13 also outputs an absolute value of a difference between an output of the adder ADD 11 and an output of the adder ADD 12, to a Jacobian table T11.

The Jacobian table T11 is comprised of wired logics such that the following relation (21) is established.

$$\int_c (|\delta_1 - \delta_2|) = \log_A \left[ 1 + A^{\alpha_{\log 2} - \alpha_{\log 1} + [\Sigma_i Y_i \cdot x_{2i}] - [\Sigma_i Y_i \cdot x_{1i}]} \right] \quad (21)$$

Figure 7:
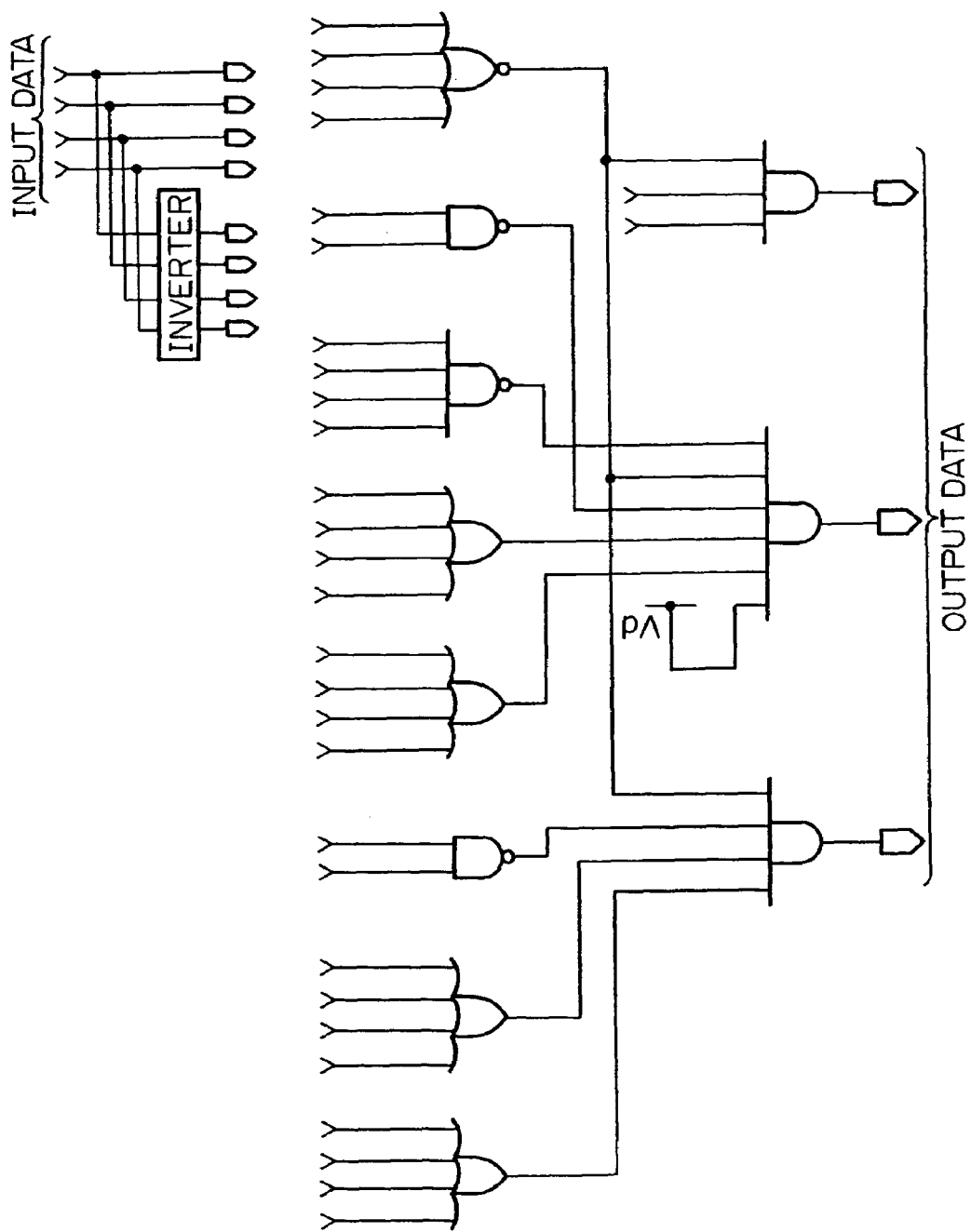
FIG. 7 is a circuit diagram of an example of Jacobian table comprised of logic circuits.
Figure 8:
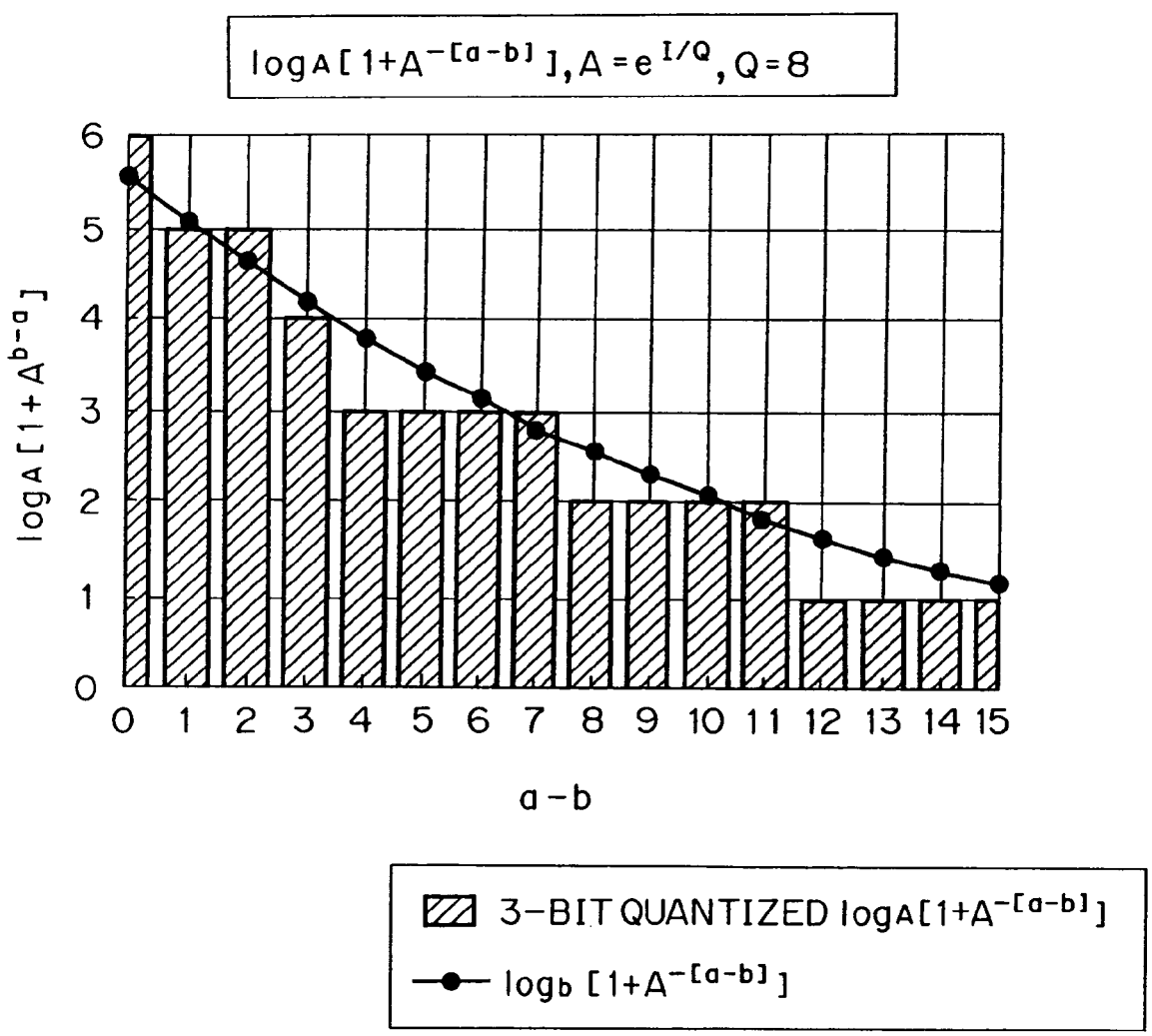
FIG. 8 is a graph showing a relation between input and output in the circuit illustrated in FIG. 7.

FIG. 7 illustrates an example of a Jacobian table comprised of wired logic circuits, and FIG. 8 illustrates a relation between input and output in the Jacobian table illustrated in FIG. 7.

The wired logic circuit illustrated in FIG. 7 decodes input data having 4 bits, and outputs corrected data having 3 bits. Though connection of input data and inverter output to a logic gate is omitted in FIG. 7, the connection is determined in accordance with I/O relation.

As illustrated in FIG. 8, for instance, when the wired logic circuit receives an input (a–b) equal to 7, the wired logic circuit outputs 3 as corrected data. For another instance, when the wired logic circuit receives an input (a–b) equal to 12, the wired logic circuit outputs 1 as corrected data.

An output of the selector SEL 11 and corrected data transmitted from the Jacobian table T11 are added to each other in an adder ADD 14. Calculation carried out in the adder ADD 14 corresponds to the calculation defined in accordance with the following equation (22).

$$\alpha_{\log 3} = \alpha_{\log 1} 1 \left[ \sum_i Y_i \cdot x_{1i} \right] + \log_A \left[ 1 + A^{\alpha_{\log 2} - \alpha_{\log 1} + \lceil \Sigma_i Y_i \cdot x_{2i} \rceil - \lceil \Sigma_i Y_i \cdot x_{1i} \rceil} \right] \quad (22)$$

The results of calculation carried out by the adder ADD 14 are stored in the memory 602, and further, fed back to the state register (S00).

The up-down counter 603 has a count width corresponding to a data bit length in a frame to be processed, and is incremented in each of data bits. A final bit in a frame to be processed defines a final address.

Data stored in the memory 602 is transmitted to the log likelihood computing circuit 504 at a predetermined timing.

Figure 9:
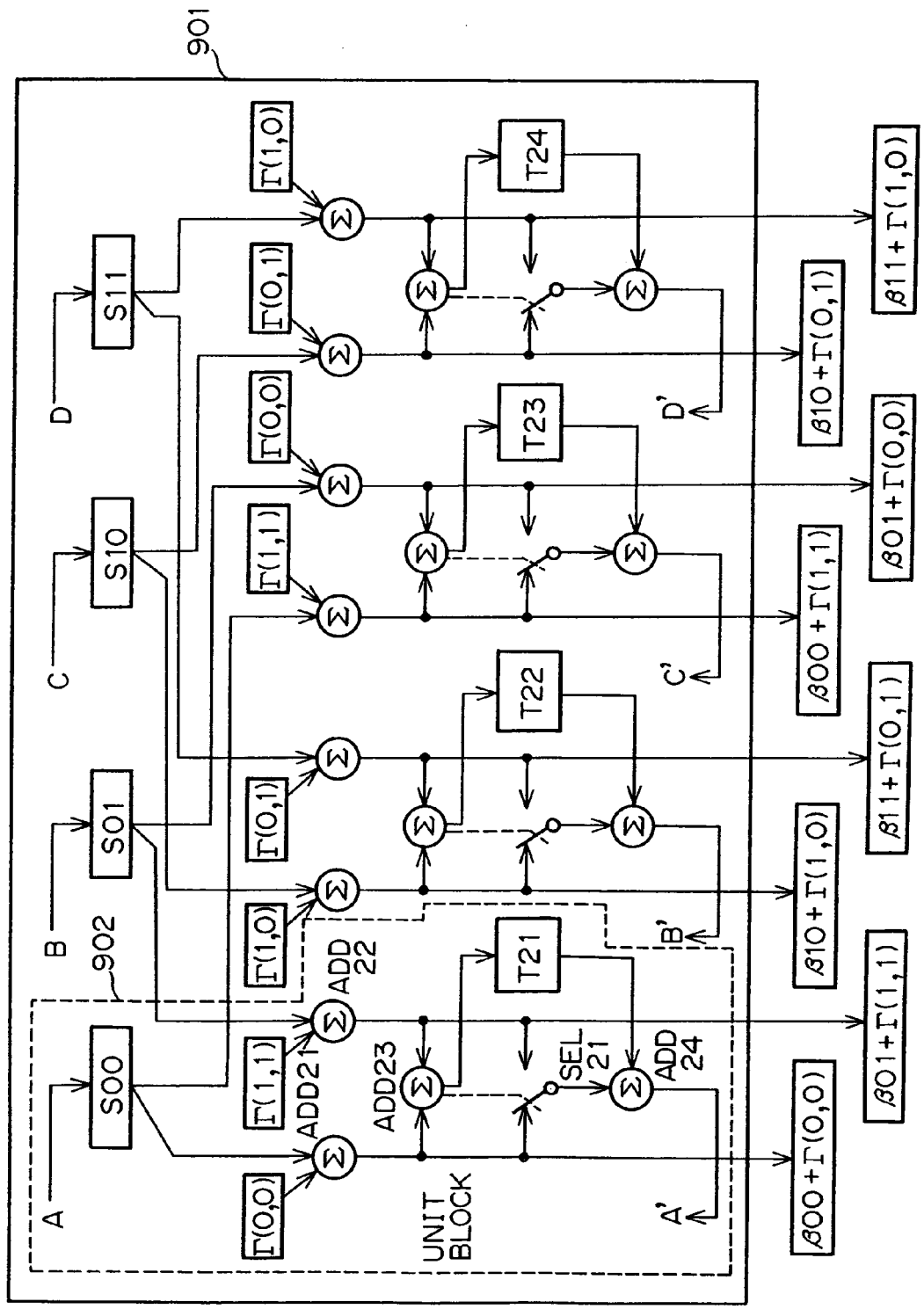
FIG. 9 is a block diagram of an example of the beta metric producing circuit illustrated in FIG. 5.

Hereinbelow is explained the beta metric producing circuit 503 illustrated in FIG. 5, with reference to FIG. 9. FIG. 9 is a block diagram of an example of the beta metric producing circuit 503 illustrated in FIG. 5.

The illustrated beta metric producing circuit 503 is designed to include ACS circuit 901 which carries out calculation, based on the alpha and gamma metrics Γ(0, 0), Γ(1, 1), Γ(1, 0) and Γ(0, 1).

The alpha metric producing circuit 502 illustrated in FIG. 6 stores metrics in each of the states, in the memory 602. In contrast, the beta metric producing circuit 503 stores only a metric produced at a target time, in the state register (S00, S01, S10, S11) for updating. This is because a direction in which the alpha metric is updated is contrary to a direction in which the beta metric is updated. When a likelihood associated with a data bit at a target time, it would be necessary to prepare both the alpha and beta metrics associated with the target time. To this end, at least one of the alpha and beta metrics has to include a memory.

In the alpha metric producing circuit 502 illustrated in FIG. 6 and the beta metric producing circuit 503 illustrated in FIG. 7, results of calculation of alpha metrics are stored in a memory, and a likelihood is computed in synchronization with updating beta metrics. In contrast, results of calculation of beta metrics may be stored in a memory, and a likelihood may be computed in synchronization with updating alpha metrics Similarly to the alpha metric producing circuit 502 illustrated in FIG. 6, the beta metric producing circuit 503 illustrated in FIG. 9 is designed to have a structure in order to carry out calculation for a metric including four states (S00, S01, S10, S11), completely in parallel with one another. However, it should be noted that the beta metric producing circuit 503 is applicable to calculation of an beta metric including eight states, for instance.

In FIG. 9, signal points A and A', signal points B and B', signal points C and C', and signal points D and D' are connected to each other, respectively, and results of calculation of beta metrics are fed back to a state register (S00, S01, S10, S11), and updated in the state register. The state register (S00, S01, S10, S11) in ACS circuit 901 and each of adders are connected through wires in accordance with a predetermined torelis chart.

ACS circuit 901 is comprised of the same four circuits which are different from one another only in connection between the state register and the adder. Hereinbelow is explained an operation of the circuit located leftmost in FIG. 9. The circuit is designated as a unit block 902.

An output of the state register (S00), and a gamma metric $\Gamma(0, 0)$ are input into an adder ADD 21 in the unit block 902. An output of the state register (S01), and a gamma metric $\Gamma(1, 1)$ are input into an adder ADD 22 in the unit block 902.

An adder (or subtracter) ADD 23 receives outputs of the adders ADD 21 and 22, and compares them to each other to detect which one is greater. Outputs of the adders ADD 21 and 22 are input into a selector SEL 21. The selector SEL 21 selects one of the outputs of the adders ADD 21 and 22 in accordance with results of comparison carried out by the adder ADD 23, and transmits the selected output.

The adder ADD 23 also outputs an absolute value of a difference between an output of the adder ADD 21 and an output of the adder ADD 22, to a Jacobian table T21.

The Jacobian table T21 is comprised of wired logics such that the following relation (23) is established.

$$f_c(|\delta_1 - \delta_2|) = \log_A\left[1 + A^{\beta_{\log 2} - \beta_{\log 1} + [\Sigma_i Y_i \cdot x_{2i}] - [\Sigma_i Y_i \cdot x_{1i}]}\right] \quad (23)$$

Similarly to the alpha metric producing circuit 502, the Jacobian table is comprised of the wired logic circuits illustrated in FIG. 7, and has such I/O relation as illustrated in FIG. 8.

An output of the selector SEL 21 and corrected data transmitted from the Jacobian table T21 are added to each other in an adder ADD 24. Calculation carried out in the adder ADD 24 corresponds to the calculation defined in accordance with the following equation (24).

$$\beta_{\log 3} - \beta_{\log 1} + \left[\sum_i Y_i \cdot x_{1i}\right] + \log_A\left[1 + A^{\beta_{\log 2} - \beta_{\log 1} + [\Sigma_i Y_i \cdot x_{2i}] - [\Sigma_i Y_i \cdot x_{1i}]}\right] \quad (24)$$

The results of calculation carried out by the adder ADD 24 is fed back to the state register (S00). An output of the adder ADD 21, and an output of the adder ADD 22 are transmitted to the log likelihood computing circuit 504 illustrated in FIG. 5.

Hereinbelow is explained the log likelihood computing circuit 504 illustrated in FIG. 5, with reference to FIG. 10.

Figure 10:
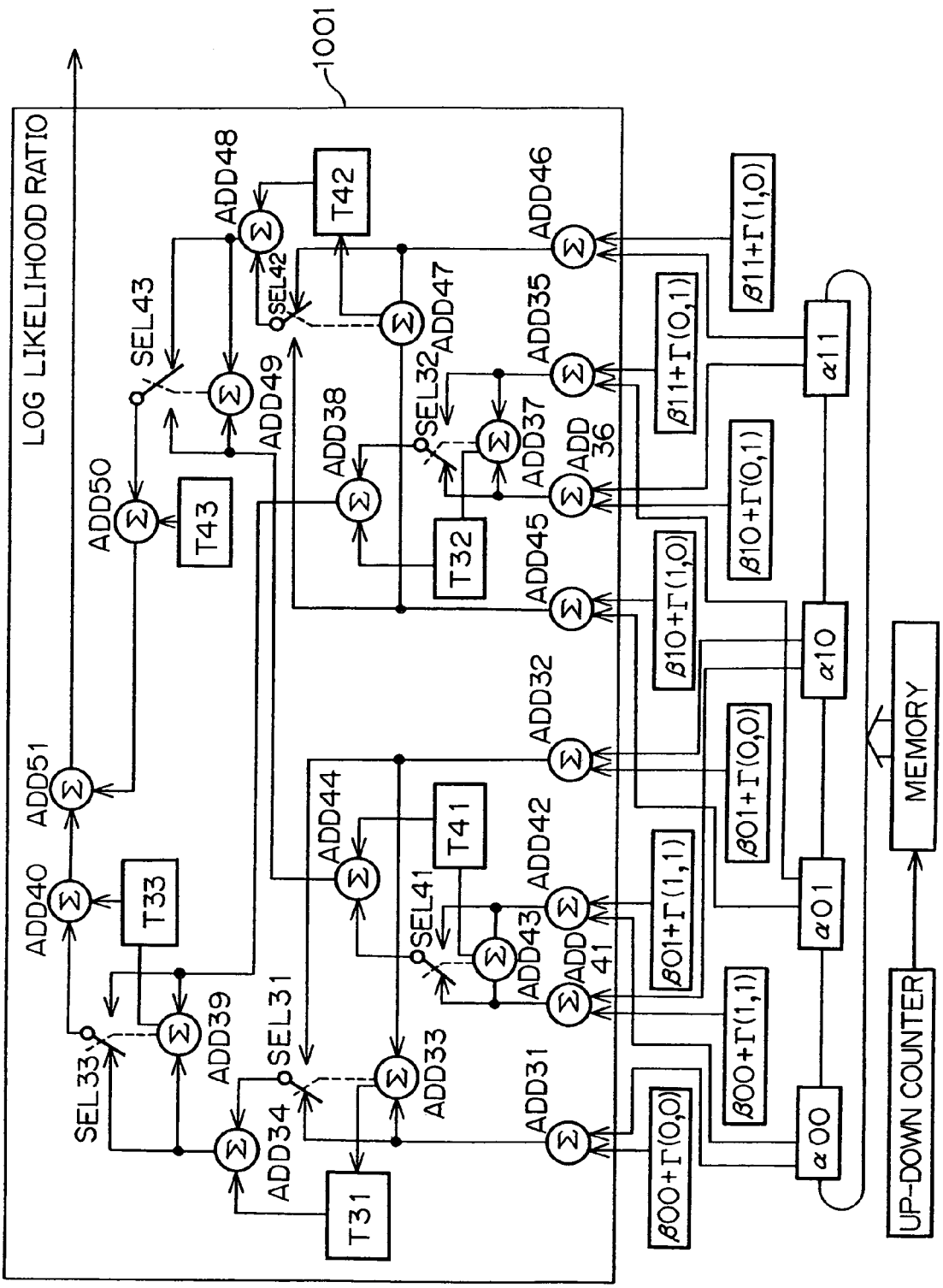
FIG. 10 is a block diagram of an example of the circuit for computing log likelihood, illustrated in FIG. 5.

FIG. 10 is a block diagram of an example of the log likelihood computing circuit 504 illustrated in FIG. 5.

As illustrated in FIG. 10, the log likelihood computing circuit 504 is designed to include a likelihood computing circuit 1001 which computes a likelihood, based on results of calculation carried out by both the alpha metric producing circuit and the beta metric producing circuit.

The result of adding the gamma and beta metrics, transmitted from the beta metric producing circuit 503, and the alpha metric associated with the result, read out of the memory 602, are input into the likelihood computing circuit 1001. In general, alpha metrics are updated in an order of data bit arrangement in a received frame, and beta metrics are updated from a final bit. Hence, when a likelihood is computed in synchronization with calculation carried out in the beta metric producing circuit, data is successively read out of the memory 602 firstly from a final address.

Though the present invention is applicable to a sliding window type likelihood computing circuit by replacing alpha metrics with new ones each time, there is used one shot type likelihood computing circuit herein for the purpose of simplifying explanation.

Since the likelihood computing circuit 1001 illustrated in FIG. 10 carries out calculation in a signal direction, the calculation may be made in pipeline. For instance, a flip-flop (F/F) circuit may be incorporated into the likelihood computing circuit 1001. Hence, calculation for one data bit is carried out per a clock.

The alpha metrics ($\alpha 00, \alpha 01, \alpha 10, \alpha 11$) read out of the memory 602, and a sum of the gamma and beta metrics transmitted from the beta metric producing circuit ($\beta 00+\Gamma(0, 0), \beta 00+\Gamma(1, 1), \beta 01+\Gamma(1, 1), \beta 01+\Gamma(0, 0), \beta 10+\Gamma(1, 0), \beta 10+\Gamma(0, 1), \beta 11+\Gamma(0, 1), \beta 11+\sigma(1, 0)$) are processed in the likelihood computing circuit 1001 in accordance with a torelis chart, respectively.

In FIG. 10, hereinbelow is explained a torelis associated with data bit of "0".

A torelis associated with data bit of "0" corresponds to an output of an adder ADD 31, that is, a sum of $\alpha 00$ and $\beta 00+\Gamma(0, 0)$ or an output of an adder ADD 32, that is, a sum of $\alpha 10$ and $\beta 01+\Gamma(0, 0)$.

An adder (or subtracter) ADD 33 receives outputs of the adders ADD 31 and 32, and compares them to each other to detect which one is greater. Outputs of the adders ADD 31 and 32 are input into a selector SEL 31. The selector SEL 31 selects one of the outputs of the adders ADD 31 and 32 in accordance with results of comparison carried out by the adder ADD 33, and transmits the selected output.

The adder ADD 33 also outputs an absolute value of a difference between an output of the adder ADD 31 and an output of the adder ADD 32, to a Jacobian table T31.

The Jacobian table T31 is represented in accordance with the equation (25), and is comprised of wired logics such that the correction term fc ($|\delta_1-\delta_2|$) is defined in accordance with the following equation (26).

$$\log_A[\alpha_1 \cdot \beta_1 \cdot \gamma_1 + \alpha_2 \cdot \beta_2 \cdot \gamma_2] = \qquad (25)$$

$$\log_A\left[(\alpha_1 \cdot \beta_1 \cdot \gamma_1) \cdot \left(1 + \frac{\alpha_2 \cdot \beta_2 \cdot \gamma_2}{\alpha_1 \cdot \beta_1 \cdot \gamma_1}\right)\right] \therefore L_{\log 1} = \alpha_{\log 1} + \beta_{\log 1} +$$

$$\gamma_{\log 1} + \log_A\left[1 + A^{\{\alpha_{\log 2}+\beta_{\log 2}+\gamma_{\log 2}-\alpha_{\log 1}-\beta_{\log 1}-\gamma_{\log 1}\}}\right]$$

$$f_C(|\delta_1-\delta_2|) =$$
$$\log_A[1+A^{\{\alpha_{\log 2}+\beta_{\log 2}+\gamma_{\log 2}-\alpha_{\log 1}-\beta_{\log 1}-\gamma_{\log 1}\}}] \qquad (26)$$

Similarly to the alpha metric producing circuit 502, the Jacobian table is comprised of the wired logic circuits illustrated in FIG. 7, and has such I/O relation as illustrated in FIG. 8.

An output of the selector SEL 31 and corrected data transmitted from the Jacobian table T31 are added to each other in the adder ADD 34. Calculation carried out in the adder ADD 34 corresponds to the calculation defined in the equation (25).

A torelis associated with data bit of "0" corresponds to an output of an adder ADD 35, that is, a sum of $\alpha 01$ and $\beta 11+\Gamma(0, 1)$ or an output of an adder ADD 36, that is, a sum of $\alpha 11$ and $\beta 10+\Gamma(0, 1)$.

An adder (or subtracter) ADD 37 receives outputs of the adders ADD 35 and 36, and compares them to each other to detect which one is greater. Outputs of the adders ADD 35 and 36 are input into a selector SEL 32. The selector SEL 32 selects one of the outputs of the adders ADD 35 and 36 in accordance with results of comparison carried out by the adder ADD 37, and transmits the selected output.

The adder ADD 37 also outputs an absolute value of a difference between an output of the adder ADD 35 and an output of the adder ADD 36, to a Jacobian table T32.

The Jacobian table T32 is represented in accordance with the equation (27), and is comprised of wired logics such that the correction term fc ($|\delta_3-\delta_4|$) is defined in accordance with the following equation (28).

$$\log_A[\alpha_3 \cdot \beta_3 \cdot \gamma_3 + \alpha_4 \cdot \beta_4 \cdot \gamma_4] = \qquad (27)$$

$$\log_A\left[(\alpha_3 \cdot \beta_3 \cdot \gamma_3) \cdot \left(1 + \frac{\alpha_4 \cdot \beta_4 \cdot \gamma_4}{\alpha_3 \cdot \beta_3 \cdot \gamma_3}\right)\right] \therefore L_{\log 2} = \alpha_{\log 3} + \beta_{\log 3} +$$

$$\gamma_{\log 3} + \log_A\left[1 + A^{\{\alpha_{\log 4}+\beta_{\log 4}+\gamma_{\log 4}-\alpha_{\log 2}-\beta_{\log 2}-\gamma_{\log 3}\}}\right]$$

$$f_C(|\delta_3-\delta_4|) =$$
$$\log_A[1+A^{\{\alpha_{\log 4}+\beta_{\log 4}+\gamma_{\log 4}-\alpha_{\log 3}-\beta_{\log 3}-\gamma_{\log 3}\}}] \qquad (28)$$

Similarly to the alpha metric producing circuit 502, the Jacobian table T32 is comprised of the wired logic circuits illustrated in FIG. 7, and has such I/O relation as illustrated in FIG. 8.

An output of the selector SEL 32 and corrected data transmitted from the Jacobian table T32 are added to each other in the adder ADD 38. Calculation carried out in the adder ADD 38 corresponds to the calculation defined in the equation (27).

The above-mentioned torelis associated with data bit of "0" are combined to each other. Specifically, an adder (or subtracter) ADD 39 receives outputs of the adders ADD 34 and 38, and compares them to each other to detect which one is greater. Outputs of the adders ADD 34 and 38 are input into a selector SEL 33. The selector SEL 33 selects one of the outputs of the adders ADD 34 and 38 in accordance with results of comparison carried out by the adder ADD 39, and transmits the selected output.

The adder ADD 39 also outputs an absolute value of a difference between an output of the adder ADD 34 and an output of the adder ADD 38, to a Jacobian table T33.

The Jacobian table T33 is represented in accordance with the equation (29), and is comprised of wired logics such that the correction term fc ($|\delta_1-\delta_2|$) is defined in accordance with the following equation (30).

$$\log_A[L_1 + L_2] = \qquad (29)$$

$$\log_A\left[(L_1) \cdot \left(1 + \frac{L_1}{L_2}\right)\right] \therefore L_{\log p} = L_{\log 1} + \log_A\left[1 + A^{\{L_{\log 2}-L_{\log 1}\}}\right]$$

$$f_C(|\delta_1-\delta_2|) = \log_A[1+A^{\{L_{\log 2}-L_{\log 1}\}}] \qquad (30)$$

Similarly to the alpha metric producing circuit 502, the Jacobian table T33 is comprised of the wired logic circuits illustrated in FIG. 7, and has such I/O relation as illustrated in FIG. 8.

An output of the selector SEL 33 and corrected data transmitted from the Jacobian table T33 are added to each other in the adder ADD 40. Calculation carried out in the adder ADD 40 corresponds to the calculation defined in the equation (29).

In the above-mentioned equations (29) and (30), it is assumed that $\delta 1$ is equal to or greater than $\delta 2$ ($\delta 1 \geq \delta 2$) in the terms selected by the selector SEL 33. That is, the equation (30) is established when $L_{\log 1}$ is equal to or greater than $L_{\log 2}$ ($L_{\log 1} \geq L_{\log 2}$). Hence, if the conditions for selection are reversed, exponential terms of A have to be changed accordingly.

Hereinbelow is explained a torelis associated with data bit of "1".

A torelis associated with data bit of "1" corresponds to an output of an adder ADD 41, that is, a sum of $\alpha 10$ and $\beta 01+\Gamma(1, 1)$ or an output of an adder ADD 42, that is, a sum of $\alpha 00$ and $\beta 01+\Gamma(1, 1)$.

An adder (or subtracter) ADD 43 receives outputs of the adders ADD 41 and 42, and compares them to each other to detect which one is greater. Outputs of the adders ADD 41 and 42 are input into a selector SEL 41. The selector SEL 41 selects one of the outputs of the adders ADD 41 and 42 in accordance with results of comparison carried out by the adder ADD 43, and transmits the selected output.

The adder ADD 43 also outputs an absolute value of a difference between an output of the adder ADD 41 and an output of the adder ADD 42, to a Jacobian table T41.

The Jacobian table T41 is represented in accordance with the equation (31), and is comprised of wired logics such that the correction term fc ($|\delta_1,\delta_2|$) is defined in accordance with the following equation (32).

$$\log_A[\alpha_1 \cdot \beta_1 \cdot \gamma_1 + \alpha_2 \cdot \beta_2 \cdot \gamma_2] = \qquad (31)$$

$$\log_A\left[(\alpha_1 \cdot \beta_1 \cdot \gamma_1) \cdot \left(1 + \frac{\alpha_2 \cdot \beta_2 \cdot \gamma_2}{\alpha_1 \cdot \beta_1 \cdot \gamma_1}\right)\right] \therefore L_{\log 1} = \alpha_{\log 1} + \beta_{\log 1} +$$

$$\gamma_{\log 1} + \log_A\left[1 + A^{\{\alpha_{\log 2}+\beta_{\log 2}+\gamma_{\log 2}-\alpha_{\log 1}-\beta_{\log 1}-\gamma_{\log 1}\}}\right]$$

$$f_C(|\delta_1-\delta_2|) =$$
$$\log_A[1+A^{\{\alpha_{\log 2}+\beta_{\log 2}+\gamma_{\log 2}-\alpha_{\log 1}-\beta_{\log 1}-\gamma_{\log 1}\}}] \qquad (32)$$

Similarly to the alpha metric producing circuit 502, the Jacobian table T41 is comprised of the wired logic circuits illustrated in FIG. 7, and has such I/O relation as illustrated in FIG. 8.

An output of the selector SEL 41 and corrected data transmitted from the Jacobian table T41 are added to each other in the adder ADD 44. Calculation carried out in the adder ADD 44 corresponds to the calculation defined in the equation (31).

A torelis associated with data bit of "1" corresponds to an output of an adder ADD 45, that is, a sum of $\alpha 01$ and $\beta 10 + \Gamma(1, 0)$ or an output of an adder ADD 46, that is, a sum of $\alpha 11$ and $\beta 01 + \Gamma(1, 0)$.

An adder (or subtracter) ADD 47 receives outputs of the adders ADD 45 and 46, and compares them to each other to detect which one is greater. Outputs of the adders ADD 45 and 46 are input into a selector SEL 42. The selector SEL 42 selects one of the outputs of the adders ADD 45 and 46 in accordance with results of comparison carried out by the adder ADD 47, and transmits the selected output.

The adder ADD 47 also outputs an absolute value of a difference between an output of the adder ADD 45 and an output of the adder ADD 46, to a Jacobian table T42.

The Jacobian table T42 is represented in accordance with the equation (33), and is comprised of wired logics such that the correction term fc ($|\delta_3 - \delta_4|$) is defined in accordance with the following equation (34).

$$\log_A[\alpha_3 \cdot \beta_3 \cdot \gamma_3 + \alpha_4 \cdot \beta_4 \cdot \gamma_4] = \quad (33)$$

$$\log_A\left[(\alpha_3 \cdot \beta_3 \cdot \gamma_3) \cdot \left(1 + \frac{\alpha_4 \cdot \beta_4 \cdot \gamma_4}{\alpha_3 \cdot \beta_3 \cdot \gamma_3}\right)\right] \therefore L_{\log 2} - \alpha_{\log 3} + \beta_{\log 3} +$$

$$\gamma_{\log 3} + \log_A\left[1 + A^{\{\alpha_{\log 2} + \beta_{\log 3} + \gamma_{\log 3} - \alpha_{\log 2} - \beta_{\log 3} - \gamma_{\log 3}\}}\right]$$

$$f_C(|\delta_3 - \delta_4|) = \log_A[1 + A^{\{\alpha_{\log 4} + \beta_{\log 4} + \gamma_{\log 4} - \alpha_{\log 3} - \beta_{\log 3} - \gamma_{\log 3}\}}] \quad (34)$$

Similarly to the alpha metric producing circuit 502, the Jacobian table T42 is comprised of the wired logic circuits illustrated in FIG. 7, and has such I/O relation as illustrated in FIG. 8.

An output of the selector SEL 42 and corrected data transmitted from the Jacobian table T42 are added to each other in the adder ADD 48. Calculation carried out in the adder ADD 48 corresponds to the calculation defined in the equation (33).

The above-mentioned torelis associated with data bit of "1" are combined to each other. Specifically, an adder (or subtracter) ADD 49 receives outputs of the adders ADD 44 and 48, and compares them to each other to detect which one is greater. Outputs of the adders ADD 44 and 48 are input into a selector SEL 43. The selector SEL 43 selects one of the outputs of the adders ADD 44 and 48 in accordance with results of comparison carried out by the adder ADD 49, and transmits the selected output.

The adder ADD 49 also outputs an absolute value of a difference between an output of the adder ADD 44 and an output of the adder ADD 48, to a Jacobian table T43.

The Jacobian table T43 is represented in accordance with the equation (35), and is comprised of wired logics such that the correction term fc ($|\delta_1 - \delta_2|$) is defined in accordance with the following equation (36).

$$\log_A[L_1 + L_2] = \quad (35)$$

$$\log_A\left[(L_1) \cdot \left(1 + \frac{L_2}{L_1}\right)\right] \therefore L_{\log M} = L_{\log 1} + \log_A\left[1 + A^{\{L_{\log 2} - L_{\log 1}\}}\right]$$

$$f_C(|\delta_1 - \delta_2|) = \log_A[1 + A^{\{L_{\log 2} - L_{\log 1}\}}] \quad (36)$$

Similarly to the alpha metric producing circuit 502, the Jacobian table T43 is comprised of the wired logic circuits illustrated in FIG. 7, and has such I/O relation as illustrated in FIG. 8.

An output of the selector SEL 43 and corrected data transmitted from the Jacobian table T43 are added to each other in the adder ADD 50. Calculation carried out in the adder ADD 50 corresponds to the calculation defined in the equation (35).

In the above-mentioned equations (35) and (36), it is assumed that $\delta 1$ is equal to or greater than $\delta 2$ ($\delta 1 - \delta 2$) in the terms selected by the selector SEL 33. That is, the equation (36) is established when $L_{\log 1}$ is equal to or greater than $L_{\log 2}$ ($L_{\log 1} \geq L_{\log 2}$). Hence, if the conditions for selection are reversed, exponential terms of A have to be changed accordingly.

An adder ADD 51 subtracts the output of the adder ADD 50, that is, the computation results $L_{\log M}$ associated with data bit of "1" from the output of the adder ADD 40, that is, the computation results $L_{\log P}$, to thereby compute the log likelihood ratio LLR output from the soft-input and soft-output decoder.

That is, the log likelihood ratio LLR is expressed as follows.

$$LLR = L_{\log P} - L_{\log M} \quad (37)$$

The log likelihood ratio LLR is fed back also to the gamma metric producing circuit 502 illustrated in FIG. 5. As mentioned earlier, in the soft-input and soft-output decoder illustrated in FIG. 5, the pre-data likelihood ratio and the information sequence are subtracted from the log likelihood ratio LLR to thereby calculate the external data likelihood ratio in the gamma metric producing circuit 502. The thus calculated external data likelihood ratio is used as a next pre-data likelihood ratio.

Accordingly, by designing the alpha metric producing circuit, the beta metric producing circuit, and the log likelihood computing circuit to have a logic circuit defining the Jacobian table such as one illustrated in FIG. 7, it would be possible to carry out computation equivalent to BCJR algorithm, in a log domain.

If performances are not degraded, at least one of the alpha metric producing circuit 502, the beta metric producing circuit 503, and the log likelihood computing circuit 504 may be designed not to include the Jacobian table, that is, not to compensate for received data, in order to reduce a size of the circuit.

Hereinbelow is explained a series arrangement type turbo encoder and a turbo decoder for decoding data which is turbo-encoded by the series arrangement type turbo encoder.

Figure 11:
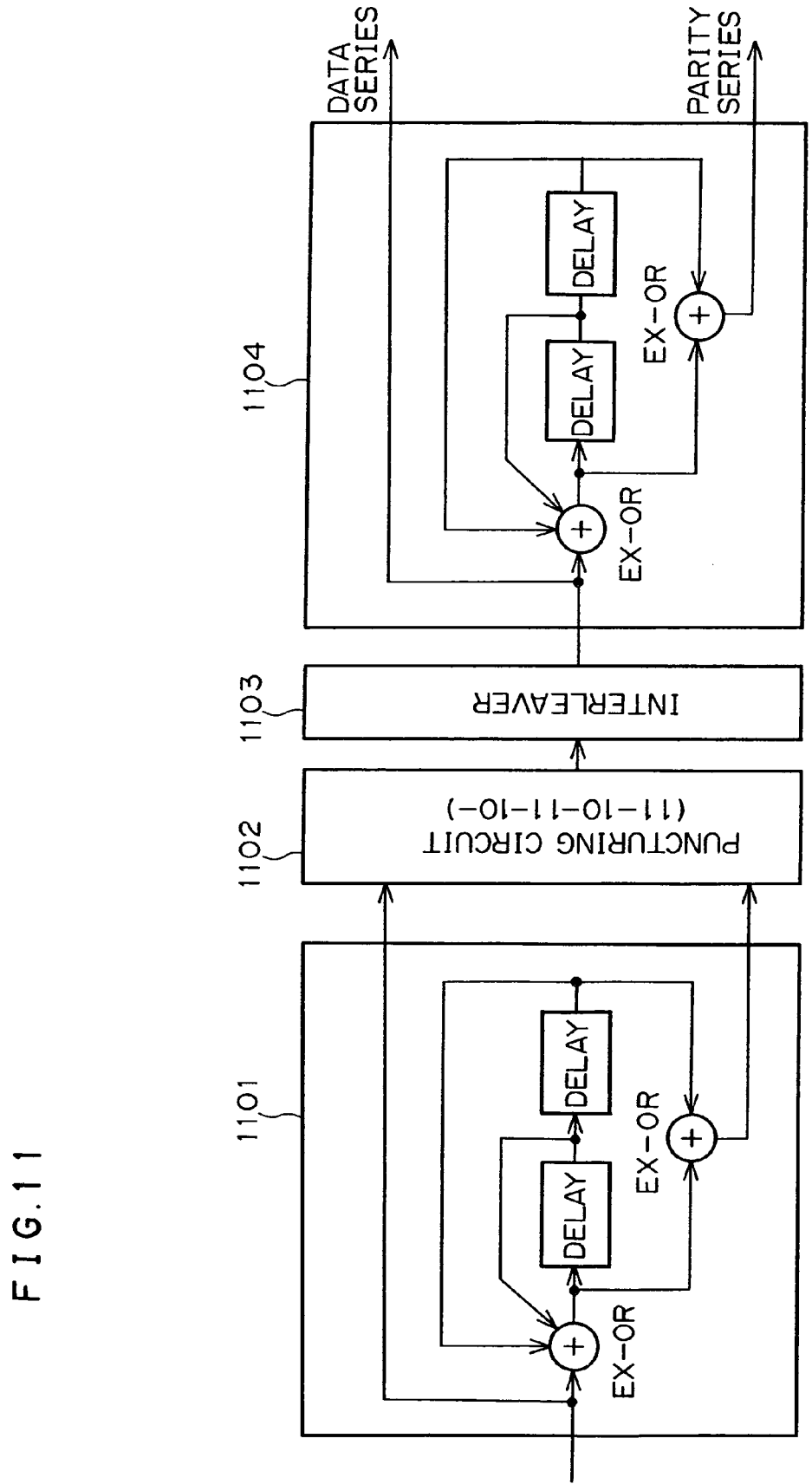
FIG. 11 is a block diagram of an example of a turbo encoder including a plurality of component encoders arranged in series with one another.
Figure 12:
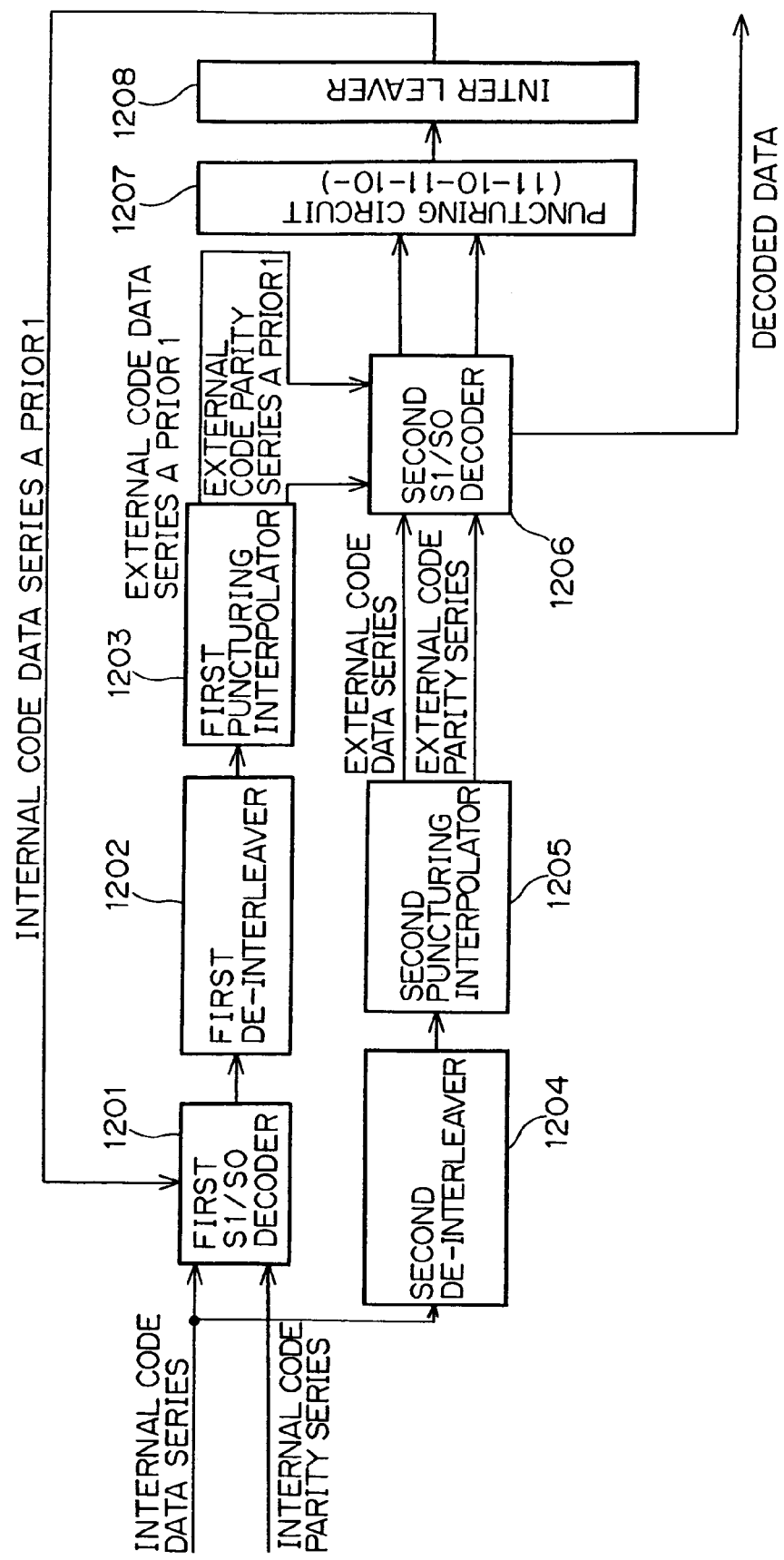
FIG. 12 is a block diagram of an example of a turbo decoder which decodes data having been turbo-encoded by the turbo encoder illustrated in FIG. 11.

FIG. 11 is a block diagram of an example of a series arrangement type turbo encoder, and FIG. 12 is a block diagram of an example of a turbo decoder for decoding data encoded by the turbo encoder illustrated in FIG. 11.

The series arrangement type turbo encoder illustrated in FIG. 11 is comprised of an external encoder 1101 including at least one component encoder into which information sequence to be encoded is input, a puncturing circuit 1102 which punctures the information sequence and the parity sequence both transmitted from the external encoder 1101, an interleaver 1103 which re-arranges bit arrangement in the information sequence and the parity sequence each in accordance with a predetermined rule, and an internal encoder 1104 including at least one component encoder and receiving the information sequence from the interleaver 1103.

The internal encoder 1104 and the external encoder 1101 both illustrated in FIG. 11 are designed to have the same structure. The information sequence and the parity sequence both transmitted from the external encoder 110 are input into the internal encoder 1104 through the puncturing circuit 1102 and the interleaver 1103.

A series arrangement type turbo encoder is usually designed to have a plurality of component encoders, similarly to the parallel arrangement type turbo encoder. The turbo encode illustrated in FIG. 11 is designed to have two component encoders.

Though the puncturing circuit 1102 and the interleaver 1103 play an important part in turbo encoding, their operation has nothing to do with the present invention, and hence, will not be explained in detail.

The puncturing circuit 1104 alternately removes bits in the parity sequence transmitted from the external encoder 1101. For instance, a sequence "11-10-11-10-" indicates significance of the information sequence and the parity sequence. Data "1" is output as it is, whereas data "0" is to be removed. That is, the second and fourth parity bits are removed in the above-mentioned sequence.

Because of alternate removal of parity bits by means of the puncturing circuit 1104, a data transmission rate in the external encoder 1101 is equal to ⅔ per a unit period of time. However, since a data transmission rate in the internal encoder 1104 is equal to ½, a total data transmission rate is equal to ⅓ in a unit period of time.

The turbo decoder associated with the series arrangement type turbo encoder, illustrated in FIG. 12 is comprised of a first soft-input and soft-output decoder 1201 associated with the internal encoder 1104 illustrated in FIG. 11, a second soft-input and soft-output decoder 1206 associated with the external encoder 1101 illustrated in FIG. 11, a first de-interleaver 1202 which re-arranges bit arrangement in the information sequence transmitted from the first soft-input and soft-output decoder 1201, back to its original bit arrangement, a second de-interleaver 1204 which re-arranges bit arrangement in internal code information sequence or received data, back to its original bit arrangement, a first puncturing interpolator 1203 which zero-interpolates punctured bits, and outputs external code information sequence a-priori and external code parity sequence a-priori which are used for the second soft-input and soft-output decoder 1206 associated with the external encoder 1101, and a second puncturing interpolator 1205 which zero-interpolates punctured bits, and separates external code information sequence a-priori and external code parity sequence a-priori from each other which are used for the second soft-input and soft-output decoder 1206 associated with the external encoder 1101.

Internal code information sequence and internal code parity sequence illustrated in FIG. 12 are comprised of data transmitted from the turbo encoder illustrated in FIG. 11 and soft-judged received data including errors generated by passing through propagation channel. The internal code information sequence and internal code parity sequence are information sequence with which a weighted coefficient is multiplied by the multiplier illustrated in FIG. 1.

The first soft-input and soft-output decoder 1201 receives the internal code information sequence, the internal code parity sequence, and the internal code information sequence a priori. Herein, the internal code information sequence a priori is designed to have an initial value of zero (0) so as not to have preference.

The first soft-input and soft-output decoder 1201 outputs an extrinsic LLR (log likelihood ratio) consisting of a log likelihood ratio for each of bit in the internal code information sequence, from which the information sequence and the internal code information sequence a priori are subtracted.

The extrinsic LLR (log likelihood ratio) output from the first soft-input and soft-output decoder 1201 is re-arranged by the first de-interleaver 1202 back to its original bit arrangement, zero-interpolated by the first puncturing interpolator 1203, and is separated into the external code information sequence a priori and the external code information sequence a priori. The external code information sequence a priori and the external code information sequence a priori both output from the first puncturing interpolator 1203 are input into a second soft-input and soft-output decoder 1206.

The internal code information sequence is re-arranged by the second de-interleaver 1204 back to its original bit arrangement, zero-interpolated by the second puncturing interpolator 1205, and is separated into the external code information sequence and the external code information sequence. The external code information sequence and the external code information sequence both output from the second puncturing interpolator 1205 are input into the second soft-input and soft-output decoder 1206.

The external code information sequence a priori and the external code parity sequence a priori are used as a priori for the external code information sequence and the external code parity sequence, respectively.

The second soft-input and soft-output decoder 1206 outputs both an external code extrinsic LLR (log likelihood ratio) consisting of a log likelihood ratio for each of bits in the external code information sequence, from which the external code information sequence and the external code information sequence a priori are subtracted, and an external code external parity log likelihood ratio consisting of a log likelihood ratio for each of bits in the external code parity sequence, from which the external code parity sequence and the external code parity sequence a priori are subtracted.

The external code external log likelihood ratios correspond to an output of the external encoder illustrated in FIG. 11. The external code external log likelihood ratios transmitted from the second soft-input and soft-output decoder 1206 are input into the puncturing circuit 1207 and then the interleaver 1208, and output from the interleaver 1208 as a priori for the internal code information sequence.

The thus produced internal code information sequence a priori is fed back to the first soft-input and soft-output decoder 1201, and is used as a priori for each of bits in the internal code information sequence.

Hereinafter, the same steps as mentioned above are repeatedly carried out to thereby make hard decision to a final log likelihood ratio, and resultingly, decoded data are output.

The series arrangement type soft-input and soft-output decoder has basically the same structure as that of the parallel arrangement type soft-input and soft-output decoder. Accordingly, the Jacobian tables in both the soft-input and soft-output decoders have the same structure. However, the second soft-input and soft-output decoder 1206 illustrated in FIG. 12 is structurally different from the parallel arrangement type turbo decoder as follows.

The first soft-input and soft-output decoder 1201 receives a priori associated with the information sequence. On the other hand, the second soft-input and soft-output decoder 1206 receives not only a priori associated with the information sequence, but also a priori associated with the parity sequence. Accordingly, the second soft-input and soft-output decoder 1206 is necessary to have such a structure that not only the information sequence a priori but also the parity sequence a priori are considered when a gamma metric is to be produced.

In addition, the log likelihood computing circuit is necessary to additionally include a circuit for outputting a log likelihood ratio of the parity sequence. Thus, it is necessary for the log likelihood computing circuit to include such output circuits one for the information sequence and the other for the parity sequence. However, by adding a small circuit to the single log likelihood computing circuit by resource sharing, it would be possible to compute two log likelihood ratios in a single log likelihood computing circuit. Specifically, in ACS circuit including the Jacobian table, the first stage subtraction circuit is commonly used for computing both a likelihood associated with data bit and a likelihood associated with parity bit, and the second and final stages subtraction circuits are fabricated separately for computing a likelihood associated with data bit, and for computing a likelihood associated with parity bit.

As mentioned above, the turbo decoder in accordance with the present invention makes it possible to accomplish computation equivalent to BCJR algorithm merely by adding a small circuit thereto, without using algorithm accompanied with a problem of degradation in characteristics, such as Max-Log Map and SOVA.

Accordingly, in CDMA mobile communication system which can accomplish a high gain in encoding data, it would be possible to minimize power for transmitting data, increase a capacity of the system, and enhance the number of subscribers and quality in receiving data.

In accordance with the invention, since rake-combined received data with which a weighting coefficient used for power control is multiplied is transmitted to a hardware-structured turbo decoder, it is no longer necessary to have, as interfaces, noise variance and signal power which are necessary for accomplishing algorithm defined with Jacobian logarithm, and it is also no longer necessary for the turbo decoder to include a memory to store such interfaces therein.

Furthermore, it would be possible to carry out computation equivalent to BCJR algorithm which exerts less influence on an operation rate, merely by further having a hardware at a minimum degree, without necessity of having a memory used for large-sized Jacobian table including noise variance and signal power as parameters.

The parallel arrangement type and series arrangement type turbo decoders may be used without modification in an interface.

In addition, since a weighting step is carried out in each of slots, it would be possible to carry out the weighting step at an interval equal to an interval for updating transmission power control made based on SIR measurement. This ensures minimum influence on a load to be exerted on DSP software, and accomplishment of algorithm defined by Jacobian logarithm following a fading pitch.

The above-mentioned method of decoding turbo-encoded, received data in CDMA system may be accomplished as a program including various commands, and be presented through a recording medium readable by a computer.

Figure 13:
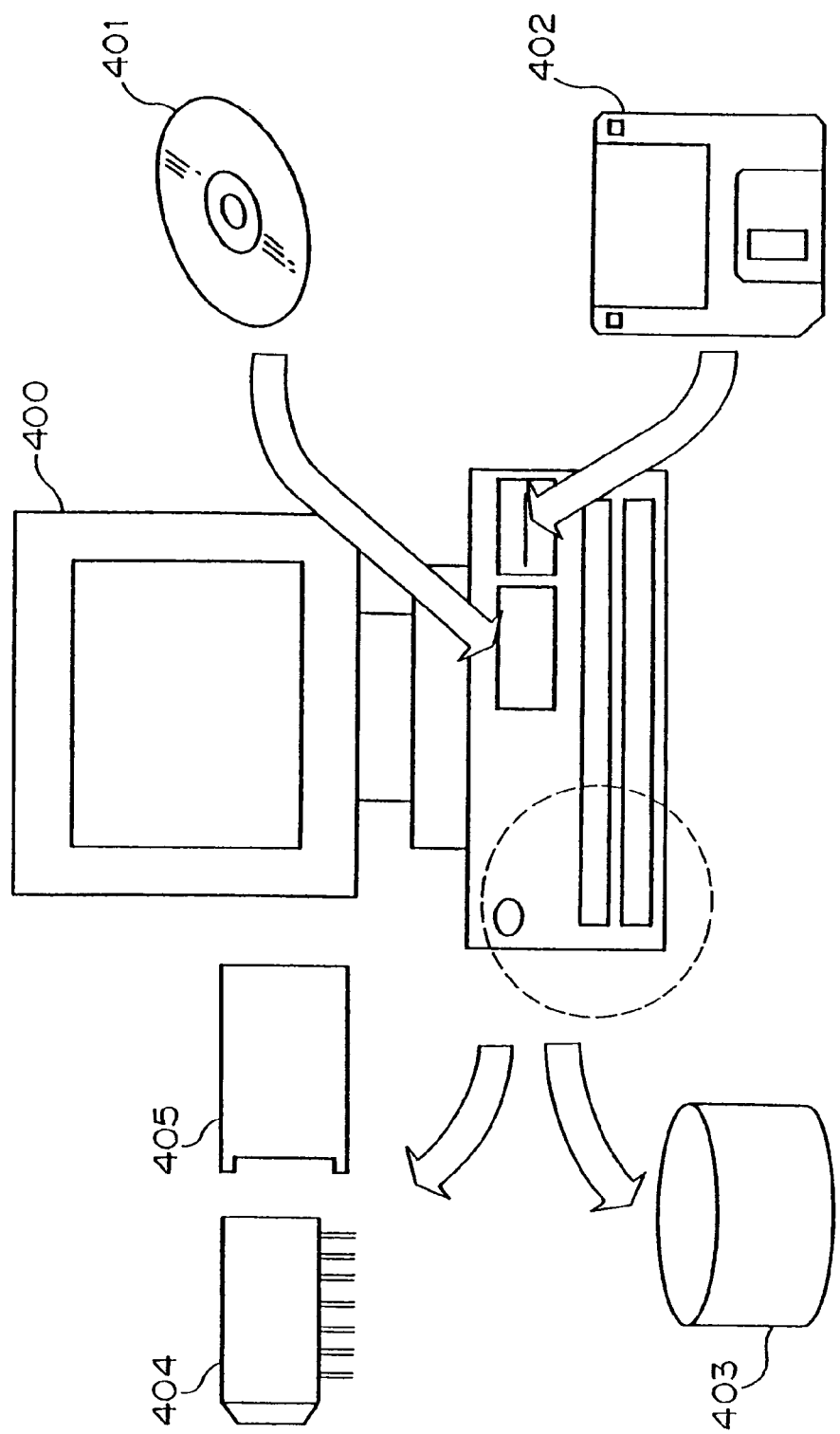
FIG. 13 illustrates examples of recording mediums in which a program for carrying out the method of decoding turbo-encoded data is to be stored.

In the specification, the term "recording medium" means any medium which can record data therein. Examples of a recording medium are illustrated in FIG. 13.

The term "recording medium" includes, for instance, a disk-shaped recorder 401 such as CD-ROM (Compact Disk-ROM) or PD, a magnetic tape, MO (Magneto Optical Disk), DVD-ROM (Digital Video Disk-Read Only Memory), DVD-RAM (Digital Video Disk-Random Access Memory), a floppy disk 402, a memory chip 404 such as RAM (Random Access Memory) or ROM (Read Only Memory), EPROM (Erasable Programmable Read Only Memory), EEPROM (Electrically Erasable Programmable Read Only Memory), smart media (Registered Trade Mark), a flush memory, a rewritable card-type ROM 405 such as a compact flush card, a hard disk 403, and any other suitable means for storing a program therein.

A recording medium storing a program for accomplishing the above-mentioned apparatus may be accomplished by programming functions of the above-mentioned apparatuses with a programming language readable by a computer, and recording the program in a recording medium such as mentioned above.

A hard disc equipped in a server may be employed as a recording medium. It is also possible to accomplish the recording medium in accordance with the present invention by storing the above-mentioned computer program in such a recording medium as mentioned above, and reading the computer program by other computers through a network.

As a computer 400, there may be used a personal computer, a desk-top type computer, a note-book type computer, a mobile computer, a lap-top type computer, a pocket computer, a server computer, a client computer, a workstation, a host computer, a commercially available computer, and electronic exchanger, for instance.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2000-19747 filed on Jun. 29, 2000 including specification, claims, drawings and summary is incorporated herein by reference in its entirety.

The invention claimed is:

1. A method of decoding turbo-encoded, received data in CDMA (Code Division Multiple Access) system which carries out closed-loop control to electric power of a data transmitter, based on a signal to interference ratio, said method comprising the steps of:

(a) weighting reverse-diffused, received data, based on both said signal to interference ratio and data obtained when said signal to interference ratio is measured;

(b) carrying out ACS operation or comparison/selection operation in a process of updating alpha metric, a process of updating beta metric, and a process for computing likelihood, to the thus weighted, received data; and (c) compensating for results of said ACS operation, based on a predetermined value associated with a difference generated when said ACS operation or said comparison/selection operation is carried out.

2. The method as set forth in claim 1, wherein said step (a) is carried out in each of slot periods.

3. The method as set forth in claim 1, wherein said step (a) includes a step of multiplying X with said reverse-diffused, received data, said X being defined as a value which is in proportion to a value obtained by dividing a root of a signal power per a slot by an interference power per a slot.

4. The method as set forth in claim 1, wherein said comparison/selection operation is carried out by means of a subtracting circuit, and said results of said ACS operation are compensated for by means of a logic circuit which receives an output or an absolute value of an output of said subtracting circuit, and outputs a predetermined value in accordance with said output.

5. The method as set forth in claim 1, wherein said step (a) is carried out through a firmware defined by a processor for processing digital signals, and said step (c) is carried out through a hardware including a logic gate.

6. A method of decoding turbo-encoded, received data in CDMA (Code Division Multiple Access) system which carries out closed-loop control to electric power of a data transmitter, based on a signal to interference ratio,
said method comprising the steps of:
(a) weighting reverse-diffused, received data, based on both said signal to interference ratio and data obtained when said signal to interference ratio is measured;
(b) carrying out ACS operation or comparison/selection operation in a process of updating alpha metric, a process of updating beta metric, and a process for computing likelihood, to the thus weighted, received data; and
(c) compensating for results of said ACS operation in at least one of said process of updating alpha metric, said process of updating beta metric, and said process for computing likelihood, based on a predetermined value associated with a difference generated when said ACS operation or said comparison/selection operation is carried out.

7. The method as set forth in claim 6, wherein said step (a) is carried out in each of slot periods.

8. The method as set forth in claim 6, wherein said step (a) includes a step of multiplying X with said reverse-diffused, received data, said X being defined as a value which is in proportion to a value obtained by dividing a root of a signal power per a slot by an interference power per a slot.

9. The method as set forth in claim 6, wherein said comparison/selection operation is carried out by means of a subtracting circuit, and said results of said ACS operation are compensated for by means of a logic circuit which receives an output or an absolute value of an output of said subtracting circuit, and outputs a predetermined value in accordance with said output.

10. The method as set forth in claim 6, wherein said step (a) is carried out through a firmware defined by a processor for processing digital signals, and said step (c) is carried out through a hardware including a logic gate.

11. A receiver for decoding turbo-encoded, received data in CDMA (Code Division Multiple Access) system which carries out closed-loop control to electric power of a data transmitter, based on a signal to interference ratio,
said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation, based on a predetermined value associated with a difference generated when said ACS operation or said comparison/selection operation is carried out.

12. The receiver as set forth in claim 11, wherein said power controller carries out weighting reverse-diffused, received data in each of slot periods.

13. The receiver as set forth in claim 11, wherein said power controller multiplies X with said reverse-diffused, received data, said X being defined as a value which is in proportion to a value obtained by dividing a root of a signal power per a slot by an interference power per a slot.

14. The receiver as set forth in claim 11, wherein said turbo decoder is comprised of:
(b1) a subtracting circuit which carries out said comparison/selection operation; and
(b2) a logic circuit which compensates for said results of said ACS operation, said logic circuit receiving an output or an absolute value of an output of said subtracting circuit, and outputting a predetermined value in accordance with said output.

15. The receiver as set forth in claim 11, wherein said power controller weights reverse-diffused, received data through a firmware defined by a processor for processing digital signals, and said turbo decoder compensates for said results of said ACS operation through a hardware including a logic gate.

16. A receiver for decoding turbo-encoded, received data in CDMA (Code Division Multiple Access) system which carries out closed-loop control to electric power of a data transmitter, based on a signal to interference ratio,
said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation in at least one of said process of updating alpha metric, said process of updating beta metric, and said process for computing likelihood, based on a predetermined value associated with a difference generated when said ACS operation or said comparison/selection operation is carried out.

17. The receiver as set forth in claim 16, wherein said power controller carries out weighting reverse-diffused, received data in each of slot periods.

18. The receiver as set forth in claim 16, wherein said power controller multiplies X with said reverse-diffused, received data, said X being defined as a value which is in proportion to a value obtained by dividing a root of a signal power per a slot by an interference power per a slot.

19. The receiver as set forth in claim 16, wherein said turbo decoder is comprised of:
(b1) a subtracting circuit which carries out said comparison/selection operation; and
(b2) a logic circuit which compensates for said results of said ACS operation, said logic circuit receiving an output or an absolute value of an output of said subtracting circuit, and outputting a predetermined value in accordance with said output.

20. The receiver as set forth in claim 16, wherein said power controller weights reverse-diffused, received data through a firmware defined by a processor for processing digital signals, and said turbo decoder compensates for said results of said ACS operation through a hardware including a logic gate.

21. A combination of a turbo encoder for turbo-encoding data to be transmitted, and a receiver for decoding turbo-encoded, received data in CDMA (Code Division Multiple Access) system which carries out closed-loop control to electric power of a data transmitter, based on a signal to interference ratio, said turbo encoder comprising a plurality of component encoders arranged in parallel with one another, said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation, based on a predetermined value associated with a difference generated when said ACS operation or said comparison/selection operation is carried out.

22. The combination as set forth in claim 21, wherein said turbo encoder includes:
(a) first to N-th component encoders each of which receives information sequence to be encoded, wherein N is an integer equal to or greater than 2;
(b) an interleaver connected to said component encoders in parallel to rearrange said information sequence in accordance with a predetermined rule, said interleaver receiving said information sequence and transmitting said information sequence to said second to N-th component encoders; and
(c) a switch which switches parity sequence transmitted said component encoders.

23. A combination of a turbo encoder for turbo-encoding data to be transmitted, and a receiver for decoding turbo-encoded, received data in CDMA (Code Division Multiple Access) system which carries out closed-loop control to electric power of a data transmitter, based on a signal to interference ratio, said turbo encoder comprising a plurality of component encoders arranged in parallel with one another, said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation in at least one of said process of updating alpha metric, said process of updating beta metric, and said process for computing likelihood, based on a predetermined value associated with a difference generated when said ACS operation or said comparison/selection operation is carried out.

24. The combination as set forth in claim 23, wherein said turbo encoder includes:
(a) first to N-th component encoders each of which receives information sequence to be encoded, wherein N is an integer equal to or greater than 2;
(b) an interleaver connected to said component encoders in parallel to rearrange said information sequence in accordance with a predetermined rule, said interleaver receiving said information sequence and transmitting said information sequence to said second to N-th component encoders; and
(c) a switch which switches parity sequence transmitted said component encoders.

25. A combination of a turbo encoder for turbo-encoding data to be transmitted, and a receiver for decoding turbo-encoded, received data in CDMA (Code Division Multiple Access) system which carries out closed-loop control to electric power of a data transmitter, based on a signal to interference ratio, said turbo encoder comprising a plurality of component encoders arranged in series, said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation, based on a predetermined value associated with a difference generated when said ACS operation or said comparison/selection operation is carried out.

26. The combination as set forth in claim 25, wherein said turbo encoder includes:
(a) an external encoder which receives information sequence to be encoded;
(b) a puncturing circuit which punctures information sequence and parity sequence both transmitted from said external encoder;
(c) an interleaver which rearranges bit arrangement in said information sequence and said parity sequence each in accordance with a predetermined rule; and
(d) an internal encoder which receives said information sequence from said interleaver, and separates said information sequence and said parity sequence from each other.

27. A combination of a turbo encoder for turbo-encoding data to be transmitted, and a receiver for decoding turbo-encoded, received data in CDMA (Code Division Multiple Access) system which carries out closed-loop control to electric power of a data transmitter, based on a signal to interference ratio, said turbo encoder comprising a plurality of component encoders arranged in series, said receiver comprising:
(a) a power controller for weighting reverse-diffused, received data, based on both said signal to interference ratio and data obtained when said signal to interference ratio is measured; and
(b) a turbo decoder which carries out ACS operation or comparison/selection operation in a process of updating alpha metric, a process of updating beta metric, and a process for computing likelihood, to the thus weighted, received data, and compensates for results of said ACS operation in at least one of said process of updating alpha metric, said process of updating beta metric, and said process for computing likelihood, based on a predetermined value associated with a difference generated when said ACS operation or said comparison/selection operation is carried out.

28. The combination as set forth in claim 27, wherein said turbo encoder includes:
   (a) an external encoder which receives data series information sequence to be encoded;
   (b) a puncturing circuit which punctures information sequence and parity sequence both transmitted from said external encoder;
   (c) an interleaver which rearranges bit arrangement in said information sequence and said parity sequence each in accordance with a predetermined rule; and
   (d) an internal encoder which receives said information sequence from said interleaver, and separates said information sequence and said parity sequence from each other.

29. A recording medium readable by a computer, storing a program therein for causing a computer to carry out a method of decoding turbo-encoded, received data in CDMA (Code Division Multiple Access) system which carries out closed-loop control to electric power of a data transmitter, based on a signal to interference ratio,
   said method comprising the steps of:
   (a) weighting reverse-diffused, received data, based on both said signal to interference ratio and data obtained when said signal to interference ratio is measured;
   (b) carrying out ACS operation or comparison/selection operation in a process of updating alpha metric, a process of updating beta metric, and a process for computing likelihood, to the thus weighted, received data; and
   (c) compensating for results of said ACS operation, based on a predetermined value associated with a difference generated when said ACS operation or said comparison/selection operation is carried out.

30. A recording medium readable by a computer, storing a program therein for causing a computer to carry out a method of decoding turbo-encoded, received data in CDMA (Code Division Multiple Access) system which carries out closed-loop control to electric power of a data transmitter, based on a signal to interference ratio,
   said method comprising the steps of:
   (a) weighting reverse-diffused, received data, based on both said signal to interference ratio and data obtained when said signal to interference ratio is measured;
   (b) carrying out ACS operation or comparison/selection operation in a process of updating alpha metric, a process of updating beta metric, and a process for computing likelihood, to the thus weighted, received data; and
   (c) compensating for results of said ACS operation in at least one of said process of updating alpha metric, said process of updating beta metric, and said process for computing likelihood, based on a predetermined value associated with a difference generated when said ACS operation or said comparison/selection operation is carried out.

31. A recording medium readable by a computer, storing a program therein for causing a computer to act as a receiver for decoding turbo-encoded, received data in CDMA (Code Division Multiple Access) system which carries out closed-loop control to electric power of a data transmitter, based on a signal to interference ratio,
   said receiver comprising:
   (a) a power controller for weighting reverse-diffused, received data, based on both said signal to interference ratio and data obtained when said signal to interference ratio is measured; and
   (b) a turbo decoder which carries out ACS operation or comparison/selection operation in a process of updating alpha metric, a process of updating beta metric, and a process for computing likelihood, to the thus weighted, received data, and compensates for results of said ACS operation, based on a predetermined value associated with a difference generated when said ACS operation or said comparison/selection operation is carried out.

32. A recording medium readable by a computer, storing a program therein for causing a computer to act as a receiver for decoding turbo-encoded, received data in CDMA (Code Division Multiple Access) system which carries out closed-loop control to electric power of a data transmitter, based on a signal to interference ratio,
   said receiver comprising:
   (a) a power controller for weighting reverse-diffused, received data, based on both said signal to interference ratio and data obtained when said signal to interference ratio is measured; and
   (b) a turbo decoder which carries out ACS operation or comparison/selection operation in a process of updating alpha metric, a process of updating beta metric, and a process for computing likelihood, to the thus weighted, received data, and compensates for results of said ACS operation in at least one of said process of updating alpha metric, said process of updating beta metric, and said process for computing likelihood, based on a predetermined value associated with a difference generated when said ACS operation or said comparison/selection operation is carried out.

* * * * *